United States Patent
Petrie et al.

(10) Patent No.: US 9,841,485 B2
(45) Date of Patent: Dec. 12, 2017

(54) MAGNETIC FIELD SENSOR HAVING CALIBRATION CIRCUITRY AND TECHNIQUES

(71) Applicant: Allegro Microsystems, LLC, Worcester, MA (US)

(72) Inventors: Craig S. Petrie, Merrimack, NH (US); Bryan Cadugan, Bedford, NH (US)

(73) Assignee: Allegro MicroSystems, LLC, Worcester, MA (US)

( * ) Notice: Subject to any disclaimer, the term of this patent is extended or adjusted under 35 U.S.C. 154(b) by 332 days.

(21) Appl. No.: 14/541,735

(22) Filed: Nov. 14, 2014

(65) Prior Publication Data

US 2016/0139230 A1 May 19, 2016

(51) Int. Cl.
| | | |
|---|---|---|
| G01R 31/00 | (2006.01) | |
| G01R 35/00 | (2006.01) | |
| G01R 33/00 | (2006.01) | |
| G01R 33/07 | (2006.01) | |
| G01R 31/28 | (2006.01) | |
| G01D 5/14 | (2006.01) | |
| G01D 5/244 | (2006.01) | |

(52) U.S. Cl.
CPC ........ G01R 35/005 (2013.01); G01D 5/145 (2013.01); G01D 5/2448 (2013.01); G01D 5/2449 (2013.01); G01R 31/2884 (2013.01); G01R 33/0035 (2013.01); G01R 33/072 (2013.01)

(58) Field of Classification Search
CPC ...... G01D 5/142; G01R 15/20; G01R 15/202; G01R 21/08; G01R 33/06; G01R 33/07; G01R 33/077; G01R 1/44; G01R 11/18; G01R 11/185; G01R 11/19; G01R 19/32; G01R 21/14; G01J 5/16; G01K 7/10; G01L 19/0092

USPC .............................................. 324/207.2, 225

See application file for complete search history.

(56) References Cited

U.S. PATENT DOCUMENTS

| | | | |
|---|---|---|---|
| 4,236,832 A | 12/1980 | Komatsu et al. | |
| 4,438,347 A | 3/1984 | Gehring | |

(Continued)

FOREIGN PATENT DOCUMENTS

| | | |
|---|---|---|
| CN | 1 501 093 | 6/2004 |
| CN | 2009/86484 | 12/2007 |

(Continued)

OTHER PUBLICATIONS

Korean Notice of Allowance dated Jul. 31, 2015; for Korean Pat. App. No. 10-2014-7033792; 5 pages.

(Continued)

*Primary Examiner* — Tung X Nguyen
*Assistant Examiner* — Robert P Alejnikov, Jr.
(74) *Attorney, Agent, or Firm* — Daly, Crowley, Mofford & Durkee, LLP

(57) ABSTRACT

A magnetic field sensor includes at least one magnetic field sensing element configured to generate a measured magnetic field signal responsive to an external magnetic field and to generate a reference magnetic field signal responsive to a reference magnetic field and a calibration circuit configured to divide the measured magnetic field signal by the reference magnetic field signal to generate a calibrated magnetic field signal. The calibrated signal has reduced susceptibility to stress influences.

42 Claims, 12 Drawing Sheets

(56) References Cited

U.S. PATENT DOCUMENTS

| | | | |
|---|---|---|---|
| 4,752,733 A * | 6/1988 | Petr | G01D 3/021 |
| | | | 324/225 |
| 4,760,285 A | 7/1988 | Nelson | |
| 4,823,075 A | 4/1989 | Alley | |
| 4,833,406 A | 5/1989 | Foster | |
| 4,970,411 A | 11/1990 | Halg et al. | |
| 5,247,278 A | 9/1993 | Pant et al. | |
| 5,285,155 A | 2/1994 | Ueda et al. | |
| 5,329,416 A | 7/1994 | Ushiyama et al. | |
| 5,412,255 A | 5/1995 | Wallrafen | |
| 5,469,058 A | 11/1995 | Dunnam | |
| 5,521,501 A | 5/1996 | Dettmann et al. | |
| 5,621,319 A | 4/1997 | Bilotti et al. | |
| 5,640,090 A | 6/1997 | Furuya et al. | |
| 6,436,748 B1 | 8/2002 | Forbes et al. | |
| 6,437,558 B2 | 8/2002 | Li et al. | |
| 6,545,788 B1 * | 4/2003 | Ackerman | H04B 10/572 |
| | | | 372/32 |
| 6,853,178 B2 | 2/2005 | Hayat-Dawoodi | |
| 6,896,407 B2 | 5/2005 | Nomiyama et al. | |
| 7,038,448 B2 | 5/2006 | Schoot et al. | |
| 7,259,545 B2 | 8/2007 | Stauth | |
| 7,474,093 B2 | 1/2009 | Ausserlechner | |
| 7,518,354 B2 | 4/2009 | Stauth et al. | |
| 7,746,056 B2 | 6/2010 | Stauth et al. | |
| 7,923,996 B2 | 4/2011 | Doogue et al. | |
| 8,030,918 B2 | 10/2011 | Doogue et al. | |
| 8,447,556 B2 | 5/2013 | Friedrich et al. | |
| 8,542,010 B2 | 9/2013 | Cesaretti et al. | |
| 8,577,634 B2 | 11/2013 | Donovan et al. | |
| 8,680,846 B2 | 3/2014 | Cesaretti et al. | |
| 2005/0203711 A1 * | 9/2005 | Taylor | G01R 27/04 |
| | | | 702/59 |
| 2006/0202692 A1 | 9/2006 | Tatschl et al. | |
| 2007/0247141 A1 | 10/2007 | Pastre et al. | |
| 2009/0001964 A1 | 1/2009 | Stzalkowski | |
| 2009/0073433 A1 * | 3/2009 | Myrick | A61K 8/046 |
| | | | 356/306 |
| 2009/0085706 A1 | 4/2009 | Baarman et al. | |
| 2009/0212765 A1 | 8/2009 | Doogue et al. | |
| 2010/0211347 A1 * | 8/2010 | Friedrich | G01R 33/0023 |
| | | | 702/117 |
| 2011/0101975 A1 * | 5/2011 | Popovic | G01R 15/18 |
| | | | 324/251 |
| 2012/0084037 A1 * | 4/2012 | Tanaka | G01R 27/28 |
| | | | 702/85 |
| 2012/0313635 A1 | 12/2012 | Daubert | |
| 2013/0214774 A1 | 8/2013 | Cesaretti et al. | |
| 2013/0335069 A1 | 12/2013 | Vig et al. | |

FOREIGN PATENT DOCUMENTS

| | | |
|---|---|---|
| DE | 195 39 458 | 4/1997 |
| EP | 0 289 414 | 11/1988 |
| EP | 0 357 013 | 8/1989 |
| EP | 1 679 524 | 11/2005 |
| EP | 1 637 898 | 3/2006 |
| EP | 1637898 | 3/2006 |
| EP | 1 850 143 | 8/2006 |
| GB | 2 276 727 | 5/1994 |
| JP | S 6148777 A | 3/1986 |
| JP | S 63-11675 Y2 | 4/1988 |
| JP | 03-248611 | 6/1991 |
| JP | 2000/055999 | 2/2000 |
| JP | 2002/213992 | 7/2002 |
| JP | 2004/177228 | 6/2004 |
| JP | 2004/234589 | 8/2004 |
| JP | 2006/126012 | 5/2006 |
| JP | A 2006126012 A | 5/2006 |
| JP | 2008/513762 | 5/2008 |
| JP | 2011/052030 | 3/2011 |
| KR | 10-2007-0060096 | 6/2007 |
| WO | WO 9 602 849 | 2/1996 |
| WO | WO 2004/072672 | 8/2004 |
| WO | WO 2006/056829 | 6/2006 |
| WO | WO 2007/138508 | 12/2007 |
| WO | WO 2008/048379 | 4/2008 |
| WO | WO 2009/108422 | 9/2009 |
| WO | WO 2010/096367 | 8/2010 |

OTHER PUBLICATIONS

PCT Search Report and Written Opinion of the ISA; for PCT/US2015/057464 dated Jan. 22, 2016; 17 pages.
U.S. Appl. No. 12/037,393.
U.S. Appl. No. 12/959,672.
AMS Technical Article "ISO26262 in Automotive IC development: it is just a tick-box exercise, or does it induce manufactur-ers to make safer components?" dated prior to Nov. 13, 2014, 7 pages.
Ausseriechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.
Bahreyni, et al.; "A Resonant Micromachined Magnetic Field Sensor;" IEEE Sensors Journal; vol. 7, No. 9, Sep. 2007; pp. 1326-1334.
Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.
Baschirotto et al.; "Development and Analysis of PCB Vector 2-D Magnetic Field Sensor System for Electronic Compass;" IEEE Sensors Journal vol. 6, No. 2; Apr. 2006; pp. 365-371.
Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.
Demierre, et al.; "Reference Magnetic Actuator for Self-Calibration of a Very Small Hall Sensor Array;" Sensors and Actuators A97-98; Apr. 2002; pp. 39-46.
Frick, et al.; "CMOS Microsystem for AC Current Measurement with Galvanic Isolation;" IEEE Sensors Journal; vol. 3, No. 6; Dec. 2003; pp. 752-760.
Haig; "Piezo-Hall Coefficients of n~Type Silicon;" Journal of Applied Physics; vol. 64, No. 1; Jul. 1, 1988; pp. 276-282.
Hosticka; "CMOS Sensor Systems;" Sensors and Actuators A66; Apr. 1998; pp. 335-341.
Kanda et al.; "The Plezo-Hall Effect in n-Silicon;" $22^{nd}$ International Conference on the Physics of Semiconductors; vol. 1, Jan. 1995; pp. 89-92.
Krammerer et al.: "A Hall effect sensors network insensitive to mechanical stress;" Proceedings of IEEE Sensors; vol. 3, Oct. 2004; pp. 1071-1074.
Mangnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.
Manic et al.; "Short and Long-Term Stability Problems of Hall Plates in Plastic Packages;" IEEE $38^{th}$ Annual International Reliability Physics Symposium; Apr. 2000; pp. 225-230.
Manic; "Drift in Silicon Integrated Sensors and Circuits Due to the Thermo-Mechanical Stresses;" Lausanne, École Polytechnique Fédérale De Lausanne 2000; Part 1 of 2; 74 pages.
Manic; "Drift in Silicon Integrated Sensors and Circuits Due to the Thermo-Mechanical Stresses;" Lausanne, École Polytechnique Fédérale De Lausanne 2000; Part 2 of 2; 102 pages.
Manic;"Drift in Silicon Intergrated sensors and Circuits due to the Thermo-Mechanical Stresses;" Lausanne, Ecole Polytechnique Fédérale De Lausanne 2000; 170 pages.
Motz et al.; "An Integrated Magnetic Sensor with Two Continuous-Time ΔΣ-Converters and Stress Compensation Capability;" IEEE

(56) References Cited

OTHER PUBLICATIONS

International Solid-State Circuits Conference; Digest of Technical Papers; Feb. 6, 2006; ISBN: 1-4244-0079-1; pp. 1151-1160.
Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.
Motz, et al.; "An Integrated Hall Sensor Platform Design for Position, Angle and Current Sensing," IEEE Sensors 2006; Exco, Daegu, Korea / Oct. 22-25, 2006; pp. 1008-1011.
Munter; "A Low-offset Spinning-current Hall Plate;" Sensors and Actuators A21-A23; 1990; pp. 742-746.
Munter; "Electronic Circuitry for a Smart Spinning-current Hall Plate with Low Offset;" Sensors and Actuators A; Jun. 1991;. pp. 747-751.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration;" IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
Popovic; "Sensor Microsystems;" Proc. $20^{th}$ International Conference on Microelectronics (MWIL 95): vol. 2, NIS, Serbia, Sep. 12-14, 1995; pp. 531-537.
Randhawa; "Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping;" $5^{th}$ IEEE Conference on Sensors, Oct. 2007; pp. 1131-1134.
Ruther et al.; "Theromagnetic Residual Offset in Integrated Hall Plates;" IEEE Sensors Journal; vol. 3, No. 6; Dec. 2003; pp. 693-699.
Schneider;"Temperature Calibration of CMOS Magnetic Vector Probe for Contactless Angle Measurements Systems," IEDM 1996 pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silicon Hall Devices;" $8^{th}$ International Conference on Solid-State Sensors and Actuators; vol. 2; Jun. 25, 1995; pp. 237-240.
Steiner et al.; "Double-Hall Sensor with Self-Compensated Offset;" International Electron Devices Meeting; Dec. 7, 1997; ISBN: 0-7803-4100-7; pp. 911-914.
Steiner et al; Offset Reduction in Hall Devices by Continuous Spinning Current Method; Sensors and Actuators A66; 1998; pp. 167-172.
Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.
Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.
Trontelj et al; "CMOS Integrated Magnetic Field Source Used as a Reference in Magnetic Field Sensors on Common Substrate;" WEP 1-6; IMTC; May 1994; pp. 461-463.
Udo; "Limits of Offset Cancellation by the Principle of Spinning Current Hall Probe;" Proceedings of IEEE Sensors; Oct. 2004; pp. 1117-1120.
Zou et al.; "Three-Dimensional Die Surface Stress Measurements in Delaminated and Non-Delaminated Plastic Packages;" 48th Electronic Components and Technology Conference; May 25, 1998; packages 1223-1234.

PCT Search Report and Written Opinion of the ISA for Int'l PCT Application No. PCT/US2009/031776 dated Oct. 23, 2009, 20 pages.
PCT Search Report and Written Opinion of the ISA for Int'l PCT Application No. PCT/US2010/024256 dated Aug. 11, 2010, 14 pages.
PCT International Preliminary Report on Patentability and Written Opinion dated Sep. 10, 2010 for Int'l PCT Application No. PCT/US2009/031776, 10 pages.
Japanese Office Action dated Apr. 4, 2013 for Japanese Patent Application No. 2010-547666;13 Pages.
Response to Japanese Office Action filed Jul. 3, 2013 Japanese Patent Application No. 2010-547666; 13 Pages.
Japanese Office Action dated Nov. 28, 2013 for Japanese Patent Application No. 2010-547666; 7 Pages.
Response to Japanese Office Action filed Feb. 28, 2014 Japanese Patent Application No. 2010-547668; 12 Pages.
Japanese Office Action dated Sep. 29, 2014 for Japanese Patent Application No. 2010-547666; 8 Pages.
Response to Japanese Office Action filed Jan. 27, 2015 Japanese Patent Application No. 2010-547666; 11 Pages.
Chinese Office Action dated Aug. 29, 2012 for Chinese Patent Application No. 200980106535.4; 10 pages.
Response to Chinese Office Action filed Jan. 7, 2013 for Chinese Patent Application No. 200980106535.4; 15 pages.
Chinese Office Action dated Apr. 15, 2013 for Chinese Patent Application No. 200980106535.4; 9 pages.
Response to Chinese Office Action filed Jun. 27, 2013 for Chinese Patent Application No. 200980106535.4; 23 pages.
Chinese Office Action dated Nov. 7, 2013 for Chinese Patent Application No. 200980106535.4; 9 pages.
Response to Chinese Office Action filed Dec. 19, 2013 for Chinese Patent Application No. 200980106535.4; 20 pages.
Notice of Allowance dated Mar. 7, 2014 for Chinese Patent Application No. 200980106535.4; 8 pages.
Korean Office Action dated Sep. 30, 2014 for Korean Application No. 10-2010-7019498; 10 pages.
Response to Korean Office Action filed Dec. 1, 2014 for Korean Application No. 10-2010-7019498; 68 pages.
Korean Office Action dated Mar. 4, 2015 for Korean Application No. 10-2014-7033792; 6 pages.
Response to Korean Office Action filed Mar. 23, 2015 for Korean Application No. 10-2014-7033792; 13 pages.
Japanese Allowed Claims received May 25, 2015; for Japenese Pat. App. No. 2010-547666; 5 pages.
Korean Notice of Allowance with Allowed Claims (English Translation); dated Apr. 20, 2015; for Korean Pat. App. No. 10-2010-7019498; 12 pages.
Letter from Yuasa and Hara dated Jan. 28, 2016; For Japanese Pat. App. No. JP 2015-013206; 3 pages.
Japanese Notice of Reasons for Rejection dated Jan. 4, 2016; For Japanese Pat. App. No. 2015-013206; 7 pages.
English Translation of Report of Re-Examination before Appeal dated Nov. 28, 2016 for JP Appl. No. 2015-013206; 3 pages.
Letter to Yuasa and Hara dated Feb. 17, 2017 for JP Pat. Appli. No. 2015-013206; 3 pages.
Letter from Japanese Associate dated Sep. 27, 2016 indicating Notice of Appeal filed in Japan and enclosing a copy of Current Claims dated Aug. 29, 2016; for Japanese Patent Application No. 2015-013206; 3 pages.
Letter from Yuasa and Hara dated Mar. 25, 2016; For Japanese Pat. App. No. 2015-013206; 1 page.
Response 2016 with English Claims dated Mar. 17, 2016 to Japanese Office Action; For Japanese Pat. App. No. 2015-013206; 7 pages.
Letter from Yuasa and Hera dated Dec. 14, 2016 regarding Appeal for JP Pat Appl. No. 2015-013206; 3 pages.
Translation of Current Claims on file (as amended on Aug. 29, 2016) for JP 2015-013206; 2 pages.
International Preliminary Report on patentability dated May 16, 2017 for PCT Application No. PCT/US2015/057464; 13 pages.

(56) References Cited

OTHER PUBLICATIONS

"CMOS-Based Monolithic Controllers for Smart Sensors Comprising Micromembranes and Microcantilevers", Barretlino et al.; IEEE Transaction on Circuits and Systems—I. Regular Papers., vol. 54, No. 1, Jan. 2007; 12 pages.
Government of India, Patent Office Examination Report dated Mar. 6, 2017; 8 pages.
Allowed claims filed Jun. 5, 2017 for JP Pat. Appl. No. 2015-013206; 2 pages.
Letter from Shardul Amarchand Mangaldas dated Sep. 15, 2017 for Indian Pat. Appl. No. 2318/KOLNP/2010; 1 page.
Response to the First Examination Report filed Sep. 6, 2017 for Indian Pat. Appl. No. 2318/KOLNP/2010; 37 pages.

\* cited by examiner

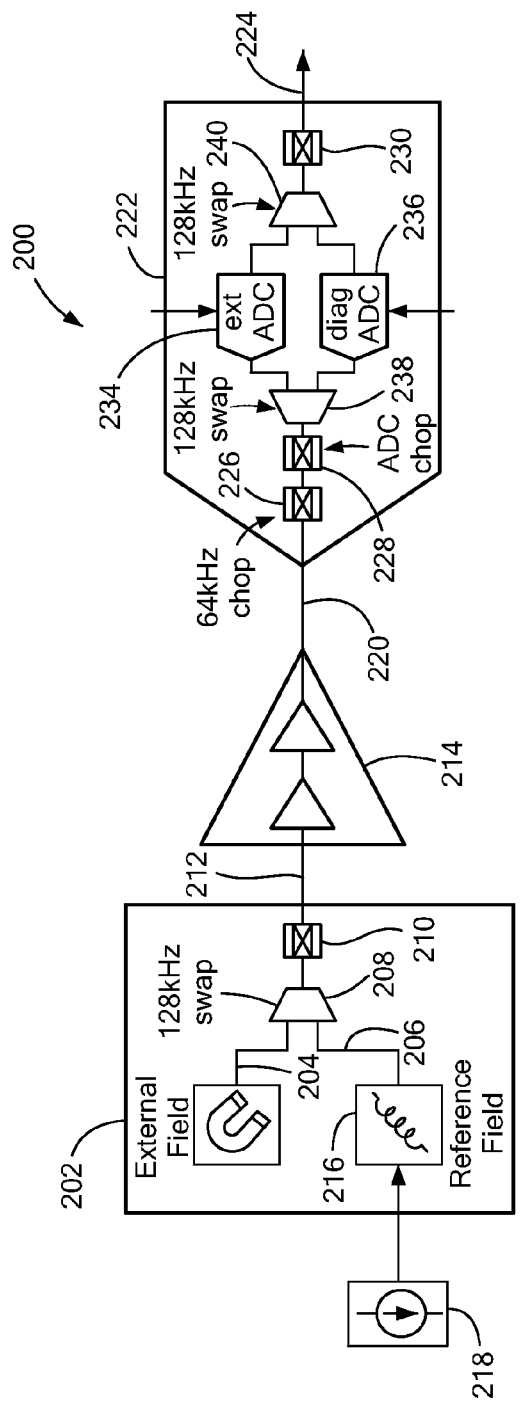
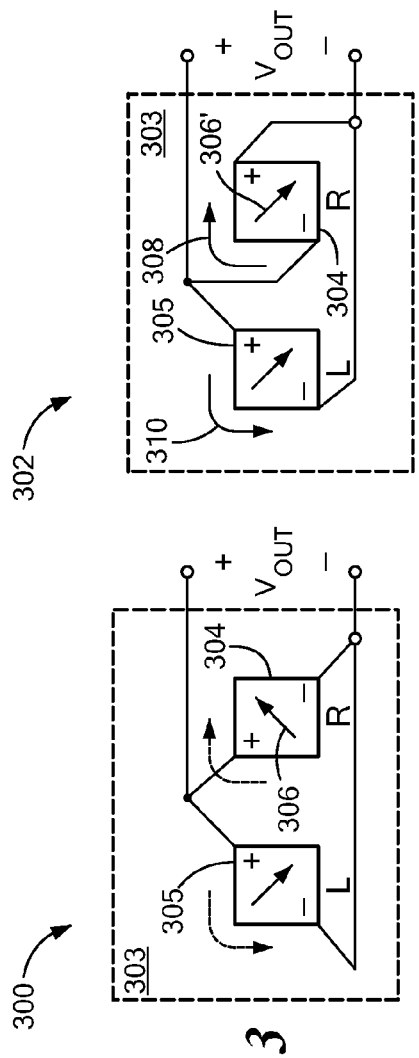
FIG. 2
FIG. 3

MAGNETIC FIELD SENSOR HAVING CALIBRATION CIRCUITRY AND TECHNIQUES

CROSS REFERENCE TO RELATED APPLICATIONS

Not Applicable.

STATEMENT REGARDING FEDERALLY SPONSORED RESEARCH

Not Applicable.

FIELD

This invention relates generally to magnetic field sensors and, more particularly, to magnetic field sensors with self-calibration circuitry and techniques.

BACKGROUND OF THE INVENTION

Magnetic field sensors, i.e., circuits that use magnetic field sensing elements, are used in a variety of applications, including, but not limited to, a current sensor that senses a magnetic field generated by a current carried by a current-carrying conductor, a magnetic switch that senses the proximity of a ferromagnetic object, a rotation detector that senses passing ferromagnetic articles, for example magnetic domains of a ring magnet, and a magnetic field sensor that senses a magnetic field density of a magnetic field.

Magnetic field sensors employ a variety of types of magnetic field sensing elements, for example, Hall effect elements and magnetoresistance elements, often coupled to a variety of electronics, all disposed over a common substrate. A magnetic field sensing element (and a magnetic field sensor) can be characterized by a variety of performance characteristics, one of which is a sensitivity, which can be expressed in terms of an output signal amplitude versus a magnetic field to which the magnetic field sensing element is exposed.

The sensitivity of a magnetic field sensing element, and therefore, of a magnetic field sensor, is known to change in relation to a number of parameters. For example, the sensitivity can change in relation to a change in temperature of the magnetic field sensing element. For another example, the sensitivity can change in relation to a strain imposed upon the substrate over which the magnetic field sensing element is disposed. Such a strain can be imposed upon the substrate at the time of manufacture of an integrated circuit containing the substrate. For example, the strain can be imposed by stresses caused by curing of molding compounds used to form an encapsulation of the substrate, e.g., a plastic encapsulation.

It will be recognized that changes in the temperature of a magnetic field sensor can directly result in changes of sensitivity due to the changes of temperature. However, the changes in the temperature of the magnetic field sensor can also indirectly result in changes of sensitivity where the temperature imparts strains upon the substrate over which the magnetic field sensing element is disposed. The changes in sensitivity of the magnetic field sensor and of the magnetic field sensing element are undesirable.

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. Alternatively, in some circuits, built-in self-test is activated by internal means, for example, by an on-chip coil or the like is used to generate a self-test magnetic field, as described in a U.S. Pat. No. 8,447,556, entitled "Circuits and Methods for Generating a Self-Test of a Magnetic Field Sensor, which patent is assigned to the assignee of the present application and incorporated herein by reference in its entirety.

Some magnetic field sensors employ self-calibration techniques, for example, by locally generating a calibration magnetic field with a coil or the like, measuring a signal resulting from the calibration magnetic field, and feeding back a signal related to the resulting signal to control a gain of the magnetic field sensor. Several self-calibration arrangements are shown and described in U.S. Pat. No. 7,923,996, entitled "Magnetic Field Sensor with Automatic Sensitivity Adjustment" and U.S. Pat. No. 8,680,846, entitled "Circuits and Methods for Self-Calibrating or Self-Testing a Magnetic Field Sensor," both of which are assigned to the assignee of the present invention. Also U.S. Pat. No. 8,542,010, entitled "Circuits and Methods for Generating a Diagnostic Mode of Operation in A Magnetic Field Sensor" and assigned to the assignee of the present invention, teaches various arrangements of coils and conductors disposed proximate to magnetic field sensing elements and used to generate a self-test magnetic field. The above application also teaches various multiplexing arrangements. These applications, and all other patents and patent applications described herein, are incorporated by reference herein in their entirety.

SUMMARY

A magnetic field sensor including at least one magnetic field sensing element configured to generate a measured magnetic field signal responsive to an external magnetic field and to generate a reference magnetic field signal responsive to a reference magnetic field further includes an analog-to-digital converter responsive to the measured magnetic field signal to generate a digital measured magnetic field signal and responsive to the reference magnetic field signal to generate a digital reference magnetic field signal, and a calibration circuit. The calibration circuit is responsive to the digital measured magnetic field signal and to the digital reference magnetic field signal to combine the digital measured magnetic field signal and the digital reference magnetic field signal in order to generate a calibrated magnetic field signal. In an embodiment, the calibration circuit includes a divider configured to divide the digital measured magnetic field signal by the digital reference magnetic field signal to generate the calibrated magnetic field signal.

According to a further aspect, a magnetic field sensor including at least one magnetic field sensing element configured to generate a measured magnetic field signal responsive to an external magnetic field and to generate a reference magnetic field signal responsive to a reference magnetic field may further include a calibration circuit configured to divide the measured magnetic field signal by the reference magnetic field signal to generate a calibrated magnetic field signal.

With these arrangements, a calibrated signal and thus, also the resulting sensor output signal, are provided with a reduced or eliminated dependence on certain influences that can adversely affect sensor accuracy, such as mechanical stresses on the package due to temperature and humidity variations that can otherwise cause the sensor output signal to vary from its nominal, trimmed value for a given external magnetic field.

Features may include one or more of the following. The magnetic field sensor may include a reference coil proximate to the at least one magnetic field sensing element, wherein the reference coil is configured to carry a reference current to generate the reference magnetic field. The magnetic field sensing element may be configurable to generate the measured magnetic field signal during a first time period and to generate the reference magnetic field signal during a second, non-overlapping time period. An output signal generator responsive to the calibrated magnetic field signal generates an output signal of the magnetic field sensor indicative of the external magnetic field. The calibration circuit may include a manufacturing trim circuit configured to adjust at least one of a gain or an offset of the digital measured magnetic field signal based on a sensed temperature. A calibration trim circuit may be provided to adjust a gain of the digital reference magnetic field signal based on a predetermined scale factor and the calibration trim circuit may be further configured to adjust at least one of the gain or an offset of the digital reference magnetic field signal based on a sensed temperature. The divider may include a multiplier configured to generate the calibrated magnetic field signal based on a Taylor series expansion. And the at least one magnetic field sensing element may be selected from Hall effect elements, magnetoresistance elements, or both.

Also described is a method for calibrating a sensed magnetic field signal including generating a measured magnetic field signal having an amplitude dependent on an external magnetic field, generating a reference magnetic field signal having an amplitude dependent on a reference magnetic field, converting the measured magnetic field signal into a digital measured magnetic field signal and converting the reference magnetic field signal into a digital reference magnetic field signal, and combining the digital measured magnetic field signal and the digital reference magnetic field signal to generate a calibrated signal.

Another method for calibrating a sensed magnetic field signal includes generating a measured magnetic field signal having an amplitude dependent on an external magnetic field, generating a reference magnetic field signal having an amplitude dependent on a reference magnetic field, and dividing the measured magnetic field signal by the reference magnetic field signal to generate a calibrated signal.

Features may include one or more of the following. Combining may include dividing the digital measured magnetic field signal by the digital reference magnetic field signal to generate the calibrated signal. The method may further include adjusting at least one of a gain or an offset of the digital measured magnetic field signal based on a sensed temperature and/or adjusting a gain of the digital reference magnetic field signal based on a predetermined scale factor. Further, adjusting the digital reference magnetic field signal may further include adjusting at least one of the gain or an offset of the digital reference magnetic field signal based on a sensed temperature. Dividing may be accomplished by multiplying a plurality of terms according to a Taylor series expansion.

BRIEF DESCRIPTION OF THE DRAWINGS

The foregoing features of the disclosure, as well as the disclosure itself may be more fully understood from the following detailed description of the drawings, in which:

FIG. 2 is a block diagram of a magnetic field sensor including an amplifier and a dual-path analog-to-digital converter.

FIG. 3. is a circuit diagram of a magnetic field sensing element illustrating chopped or switched connections to the magnetic field sensing element.

DETAILED DESCRIPTION

Figure 1:
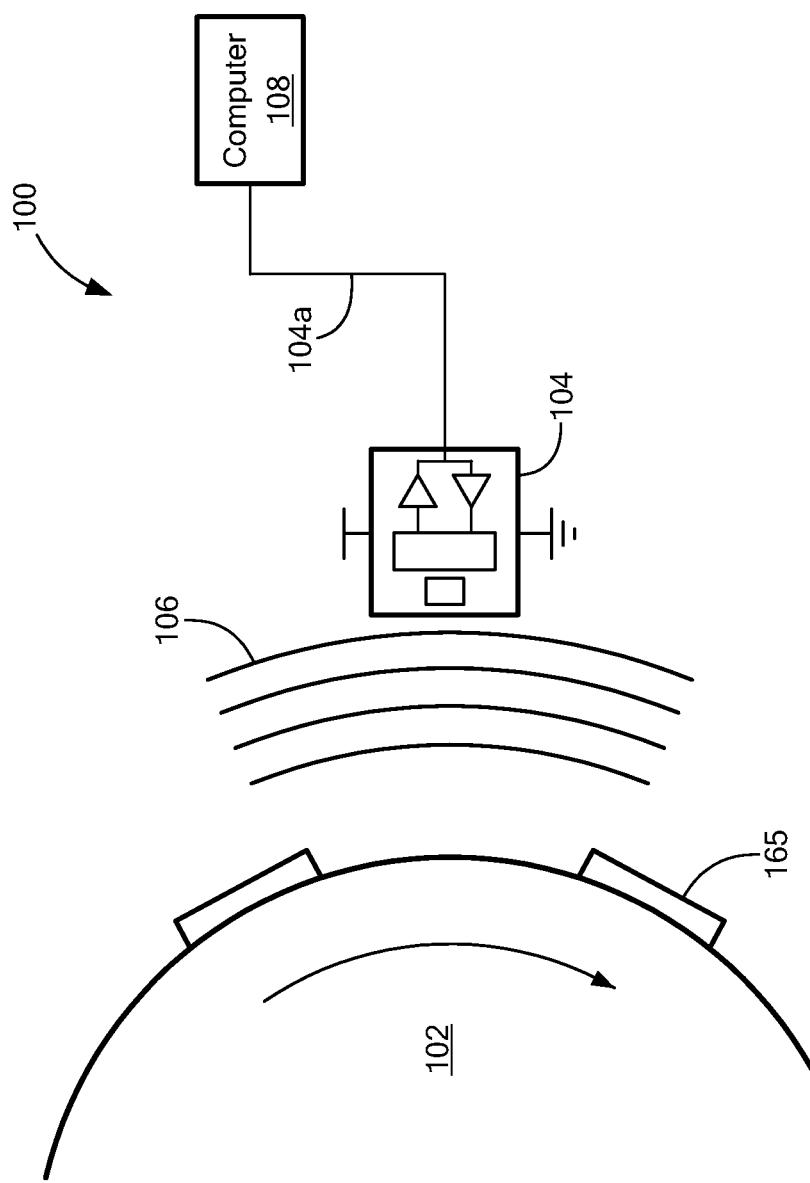
FIG. 1 is a block diagram of a system including a magnetic field sensor.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor may be used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

Turning to FIG. 1, a block diagram of a system 100 for detecting a target 102 is shown to include a magnetic field sensor 104 placed adjacent to target 102 so that a magnetic field 106 can be sensed by magnetic field sensor 104. In an embodiment, target 102 is a magnetic target and produces external magnetic field 106. In another embodiment, magnetic field 106 is generated by a magnetic source (e.g. a back-bias magnet or electromagnet) that is not physically coupled to target 102. A target 102 may be either a magnetic or a non-magnetic target. In these instances, as target 102 moves through or within magnetic field 106, it causes perturbations to external magnetic field 106 that can be detected by magnetic field sensor 104.

Magnetic field sensor 104 may detect and process changes in external magnetic field 106. For example, magnetic field sensor 104 may detect changes in magnetic field 106 as target 102 rotates and features 105 move closer to and away from magnetic field sensor 104, thus increasing and decreasing the strength of the magnetic field 106 sensed by magnetic field sensor 104. Magnetic field sensor 104 may include circuitry to determine the speed, direction, proximity, angle, etc. of target 102 based on these changes to magnetic field 106. Although magnetic target 102 is shown as a toothed gear, other arrangements and shapes that can affect magnetic field 106 as target 102 rotates are possible. For example, magnetic target 102 may have a non-symmetrical shape (such as an oval), may include sections of different material that affect the magnetic field, etc.

In an embodiment, magnetic sensor 104 is coupled to a computer 108, which may be a general purpose processor executing software or firmware, a custom processor, or a custom electronic circuit for processing output signal 104a from magnetic sensor 104. Output signal 104a may provide information about the speed, position, and/or direction of motion of target 102 to computer 108, which may then perform operations based on the received information. In an embodiment, computer 108 is an automotive computer (also referred to as an engine control unit) installed in a vehicle and target 102 is a moving part within the vehicle, such as a transmission shaft, a brake rotor, etc. Magnetic sensor 104 detects the speed and direction of target 102 and computer 108 controls automotive functions (like all-wheel drive, ABS, speedometer display control, etc.) in response to the information provided by magnetic field sensor 104.

In an embodiment, computer 108 may be located relatively distant from magnetic field sensor 104. For example, computer 108 may be located under the hood of a vehicle while magnetic field sensor 104 is located at a wheel or transmission element near the bottom and/or rear of the vehicle. In such an embodiment, having a serial communication interface with a minimal number of electrical connections (e.g. wires) between computer 108 and magnetic field sensor 104 may be beneficial, and may reduce cost and maintenance requirements.

In embodiments, where magnetic field sensor 104 operates as part of a system that affects vehicular safety such as the brake or transmission system, it may be desirable for magnetic field sensor 104 to perform self-tests and report to computer 108 any errors or faults that occur.

In embodiments, magnetic field sensor 104 includes built-in self-test ("BIST") circuits or processes that can test magnetic field sensor 104. The self-tests can include analog tests that test analog circuit portions of magnetic field sensor 104 and digital tests that test digital circuit portions of magnetic field sensor 104. The self-tests may also include test circuits or procedures that test both analog and digital portions of magnetic field sensor 104. It may be desirable for the self-tests to provide test coverage of magnetic field sensor 104 that includes as many circuits as possible, in order to increase the test coverage and effectiveness of the tests in finding faults.

Referring now to FIG. 2, a block diagram illustrates a circuit 200 that may be included in or as part of magnetic field sensor 104. Circuit 200 may be configured to detect a magnetic field (such as magnetic field 106) and process signals representing the detected magnetic field. Circuit 200 may also be configured to generate a reference magnetic field having a predetermined strength, and to perform self-tests by, for example, processing signals related to the reference magnetic field and comparing the processed signals to an expected value.

Circuit 200 includes one or more so-called signal paths, which is a path through circuit 200 over which a signal is propagated while the signal is being processed. For example, a signal may be generated by hall element(s) 202, then propagated to amplifier 214, then propagated to ADC 222 and through either converter circuit 234 or 236, and then finally propagated to an output of ADC 222 as signal 224. In general, the term signal path may refer to an electronic path, through one or more circuits, though which a signal travels. The term signal path may be used to describe an entire path or a portion of a path through which the signal travels.

In an embodiment, circuit 200 includes one or more magnetic field sensing elements (e.g. magnetic field sensing element 202) configured to measure an external magnetic field (such as magnetic field 106) and generate a measured magnetic field signal 204 that is responsive to the external magnetic field. Magnetic field sensing element 202 may also be configured measure a reference magnetic field and generate reference magnetic field signal 206 in response to the reference magnetic field. In embodiments, magnetic field sensing element 202 may be a Hall effect element, a magnetoresistive element, or another type of circuit or element that can detect a magnetic field.

Circuit 200 may also include a coil 216 which may be located proximate to magnetic field sensing element 202. A driver circuit 218 may produce a current that flows through coil 216 to produce the reference magnetic field mentioned above. The reference magnetic field may have a predetermined strength (e.g. a predetermined magnetic flux density) so that reference magnetic field signal 206 has a known value and produces predicable results when processed by circuit 200.

In an embodiment, the reference magnetic field and the external magnetic field may have magnetic field directions that are opposite to each other, or otherwise configured, so that they do not interfere with each other. The reference magnetic field signal may be a differential magnetic field that averages out when the Hall plates are in a non-differential configuration. For example, magnetic field sensing element 202 has an axis of maximum sensitivity that may be changed or switched so that, in one arrangement, the axis of maximum sensitivity is aligned to allow magnetic field sensing element 202 to detect the external magnetic field 106 and, in another arrangement, the axis of greatest sensitivity is aligned to allow magnetic field sensing element 202 to detect the reference magnetic field produced by coil 216.

In certain arrangements, coil 216 can be replaced by a permanent magnet or other magnetic source that can produce a predetermined reference magnetic field that can be detected by magnetic field sensing element 202.

Circuit 200 may also include a multiplexor 208, a chopping circuit 210, and/or other mechanisms or switch circuits that can switch a signal line (e.g. signal 212) so that measured magnetic field signal 204 is provided as an input to amplifier 214 during a measured time period and reference magnetic field signal 206 is provided as an input to amplifier 214 during a reference time period. An example of a chopping circuit is described in U.S. patent application Ser. No. 13/398,127 (filed Feb. 16, 2012), which is incorporated here by reference in its entirety.

Amplifier 214 is configured to receive and amplify measured magnetic field signal 204 during the measured time period, and to receive and amplify reference magnetic field signal 206 during the reference time period. In an embodiment, signals 204 and 206 are differential signals and amplifier 214 is a differential amplifier.

The output of amplifier 214 (i.e. amplified signal 220) may be an analog signal in certain embodiments. Thus, circuit 200 may include an analog-to-digital converter ("ADC") circuit 222 coupled to receive amplified signal 220 and convert it to a digital signal 224. Because amplifier 214 receives measured magnetic field signal 204 during a measured time period, and receives reference magnetic field signal 206 during a reference time period, amplified signal 220 may represent both signals at different times. It may represent measured magnetic field signal 204 during the measured time period and may represent reference magnetic field signal 206 during the reference time period.

ADC 222 may be referred to here as a so-called dual-path ADC because ADC 222 may have some shared circuit portions that process both measured magnetic field signal 204 and reference magnetic field signal 206, and may have other dedicated circuit portions that are configured to process either measured magnetic field signal 204 or reference magnetic field signal 206. For example, chopping circuits 226, 228, and 230 may be shared circuit portions that are configured to process both signals 204 and 206. In contrast, converter circuit 234 may be configured to process measured magnetic field signal 204 while converter circuit 236 may be configured to process reference magnetic field signal 206. ADC 222 may include multiplexors 238 and 240, or other switching circuits, that can selectively couple and de-couple converter circuits 234 and 236 from the other circuits included in ADC 222 so that converter circuit 234 processes measured magnetic field signal 204 during the measured time period and converter circuit 236 processes reference magnetic field signal 206 during the reference time period.

In an embodiment, converter circuit 234 comprises one or more capacitors that are included in an integrator circuit, and converter circuit 236 comprises one or more capacitors that are included in the same integrator circuit. As will be discussed below, ADC 222 may include one or more integrator circuits each having at least two sets of one or more capacitors each, a first set for processing measured magnetic field signal 204 and a second set for processing reference magnetic field signal 206. This will be discussed below in greater detail.

Periodically, the sets of capacitors can be swapped so that the first set of capacitors processes the reference magnetic field signal 206 and the second set of capacitors processes measured magnetic field signal 204. If the reference magnetic field signal 206 is a test signal, then swapping the capacitors can allow both sets of capacitors to process the test signal and receive test coverage.

In operation, the measured time period and the reference time period are alternating, non-overlapping time periods, and circuit 200 processes measured magnetic field signal 204 and reference magnetic field signal 206 in a time-division multiplexed ("TDM") manner. For example, during the measured time period, multiplexor 208 may be configured to propagate measured magnetic field signal 204 through to amplifier 214, and multiplexors 238 and 240 may be configured to couple converter circuit 234 to the signal path and decouple converter circuit 236 from the signal path. During the reference time period, multiplexor 208 may be configured to propagate reference magnetic field signal 206 through to amplifier 214, and multiplexors 238 and 240 may be configured to couple converter circuit 236 to the signal path and decouple converter circuit 236 from the signal path.

In an embodiment, converter circuits 234 and 236 can be swapped, as described above, after a predetermined number of time periods. If the reference magnetic field signal 206 is a test signal, this will allow both converter circuits to be tested because, by swapping them, they will each be exposed to and each process the test signal. Converter circuits 234 and 236 may also be swapped in response to a command received by the magnetic field sensor from computer 108, or in response to any other schedule or trigger.

The magnetic field produced by coil 216 may have a known value, i.e. a known strength or flux density. Thus, during the measured time period, amplified signal 220 and digital signal 224, which are ultimately derived from the magnetic field produced by coil 216 during the measured time period, may also have expected values. These expected values can be compared to predetermined test values to determine if there is a fault in circuit 200. Test coverage in circuit 200 may be increased because most of the circuitry, including amplifier 214, are shared circuits that process both the measured magnetic field signal 204 and the reference magnetic field signal 206. Using the test circuitry to process both signals increases accuracy and coverage of the test results.

Variations in silicon circuit fabrication can limit the accuracy of the measurement of the reference signal generated by the coil 216. As an example, variations in Hall plate fabrication (e.g., thickness of silicon doping, alignment of optical masks, etc.) may cause variations in Hall plate sensitivity, or responsiveness to the reference magnetic field produced by coil 216. As another example, variations in resistor fabrication (e.g., impurity atoms in the silicon material) may cause variations, as a function of temperature for example, in the coil current used to generate the reference field. Both variations can cause the measured reference field to stray from its expected value. It can be difficult to determine if this error in the reference field measurement is due to variation in the fabrication process or is due to a failure in the device. Therefore, after fabrication, the gain and/or offset of the measured reference signal can be trimmed (i.e. adjusted), as a function of temperature, so that it matches its expected value. In an embodiment, adjusting the gain and offset after fabrication includes setting or configuring a trimming circuit to perform the desired gain and/or offset of the signal. Errors in the reference field measurement detected after factory trim are then detected as circuit failures rather than variations due to silicon fabrication.

Circuit 200 may also include a trim circuit 230 that can be used to shape digital signal 224. The trim circuit 230 may include digital filters, digital adders and multipliers, and other circuits that can adjust the gain and offset of the output reference magnetic field signal (e.g. the signal produced as a result of circuit 200 processing the reference magnetic field signal 206). In an embodiment, trim circuit 230 may be an analog circuit containing analog filters and amplifiers, and may be coupled between amplifier 214 and ADC 222. Trim circuit 230 may also include chopping circuits and/or other circuits to shape signal 224. In other embodiments, trim circuit 230 may be included or embedded as part of ADC 222, or may be included or embedded in circuitry that controls the Hall plates. In the latter example, the trim circuitry may adjust the current through the Hall plate in order to adjust the Hall plate's sensitivity. Adjusting digital signal 224 during the reference time period can result in a more accurate test signal that can be compared, with greater accuracy, to the test limits described above.

Circuit 200 may also include a temperature sensor circuit (not shown in FIG. 2, but see FIG. 4) to sense the temperature of circuit 200. The amount of gain and offset adjustment performed by trim circuit 230 may be based on the temperature measured by the temperature sensor circuit. For example, if the temperature reading is high, trim circuit 230 may apply more or less gain and offset adjustment than if the temperature is low, or vice versa.

Turning now to FIG. 3, a circuit diagram 300 illustrates switching of a magnetic field sensing element in order to allow the magnetic field sensing element to detect an external magnetic field and a reference magnetic field. In diagram 300, magnetic field sensing element 303, which may be the same as or similar to magnetic field sensing element 202, includes two Hall plates 304 and 305. Magnetic field sensing element 303 is arranged so that a current 306 flows through Hall plate 304 in a first direction (e.g. from the bottom left to the top right as shown in diagram 300), and the output voltage $V_{OUT}$ of magnetic field sensing element 303 is taken across Hall plate 304 from the top left to the bottom right. Magnetic field sensing element 303 is also arranged so that a current 306 flows through Hall plate 305 in a first direction (e.g. from the top left to the bottom right as shown in diagram 300), and the output voltage $V_{OUT}$ of magnetic field sensing element 303 is taken across Hall plate 305 from the top right to the bottom left. In this arrangement, the Hall plates 304 and 305 provide an average of the detected external magnetic field 106 and reject the reference magnetic field. The axis of maximum sensitivity of the Hall plates may be configured to detect external magnetic field 106. I.e. with the current 306 flowing in this direction, the axis of greatest sensitivity of magnetic field sensing element 304 may be aligned to detect external magnetic field 106. Thus, this arrangement may be used during the measured time period to detect external magnetic field 106. Although not required, the driver circuit 218 that energizes coil 216 to produce the reference magnetic field may be disabled during measured time period so that the reference magnetic field does not interfere with the detection of external magnetic field 106 by magnetic field sensing element 303.

In diagram 302, Hall plate 304 may be switched so that current 306' flows from the top left to the bottom right, and the output voltage $V_{OUT}$ of magnetic field sensing element 304 is taken across Hall plate 304 from the bottom left to the top right. Additionally, Hall plate 305 may be switched so that current 306' also flows from the top left to the bottom right, but the output voltage $V_{OUT}$ of magnetic field sensing element 303 is taken across Hall plate 305 from the top right to the bottom left. In this arrangement, the Hall plates 304 and 305 may cancel or reject the external magnetic field 106 and provide an average of the reference magnetic field produced by coil 216. With the current 306' flowing in this direction, the axis of greatest sensitivity of Hall plate 304 may be aligned to detect the reference magnetic field produced by coil 216.

In an embodiment, the reference magnetic field produced by coil 216 is a differential magnetic field, and the arrangements of Hall plates 304 and 305 in diagram 302 allows magnetic field sensing element 303 to detect the differential magnetic field. For example, current may flow though at least a portion of coil 216 in the direction of arrow 308 to produce a local magnetic field with a direction into the page near Hall plate 304.

Current may also flow through another portion of coil 216 (or through another coil) in the direction of arrow 310 to produce a magnetic field with a direction out of the page near Hall plate 305. In the arrangement shown in diagram 302, Hall plate 304 may be configured to detect the magnetic field produced by current flowing in direction 308 and having a direction into the page, and Hall plate 305 may be configured to detect the magnetic field produced by the current flowing in direction 310 and having a direction out of the page. U.S. Pat. No. 8,680,846, which is incorporated here by reference, includes other examples of Hall plate configurations.

The illustrated configurations in FIG. 3 show one way to alternately generate a reference magnetic field signal 206. In other embodiments, there may be other possible circuits and techniques that can generate a reference magnetic field 206 that can be processed by circuit 200.

Figure 4:
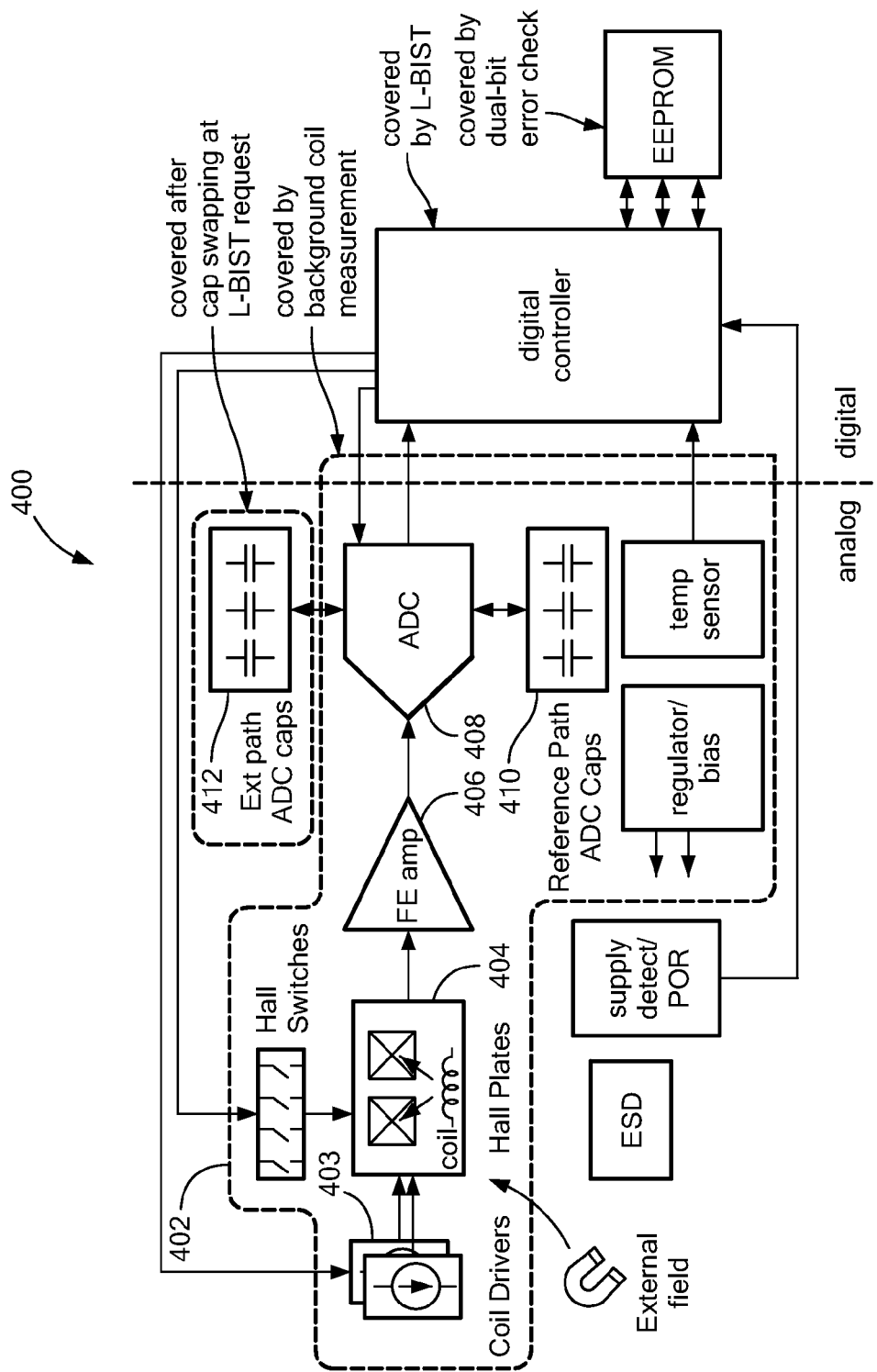
FIG. 4 is a block diagram of a magnetic field sensor illustrating test coverage.

Referring now to FIG. 4, a block diagram of a circuit 400 illustrates test coverage of the circuit. Circuit 400 may be the same as or similar to circuit 200 in FIG. 2. In an embodiment, the circuit elements within box 402 may receive test coverage while circuit 200 processes reference magnetic field signal 206. The elements may receive test coverage because they contribute to processing the reference magnetic field signal. For example, if the processed referenced magnetic field signal differs from an expected value, it can be inferred that there is a fault in at least one of the elements that contributed to processing the signal, i.e. at least one of the elements within box 402.

These elements, which the exception of capacitors 410, may be shared elements, meaning that they are configured to process both measured magnetic field signal 204 and reference magnetic field signal 206. These elements include Hall driver circuits (not shown), coil driver circuits 403, the magnetic field sensing elements 404, the amplifier 406, the ADC 408, reference signal capacitors 410, and other circuits such as regulators, biasing circuits, temperature sensors, etc. In an embodiment, magnetic field sensing elements 404 may be the same as or similar to magnetic field sensing element 202, amplifier 406 may be the same as or similar to amplifier 214, ADC 408 may be the same as or similar to ADC 222, and reference signal capacitors 410 may be the same as or similar to converter circuit 236.

Measured signal capacitors 412, which may be the same as or similar to converter circuit 234, are shown outside of test coverage box 402 because they are configured to process the measured magnetic field signal 204 and not the reference magnetic field signal 206. However, as described above, these capacitors 410 and 412 may be periodically swapped so that capacitors 412 may periodically process the reference magnetic field signal 206. Thus, test coverage may be extended to capacitors 412 during the times when capacitors 412 are processing the reference magnetic field signal 206. Additional test circuitry and techniques may also be included in magnetic field sensor 104 to test digital portions of magnetic field sensor 104, such as logic BIST circuits to test a digital controller and a dual-bit error check to test an EEPROM, for example.

Figure 5:
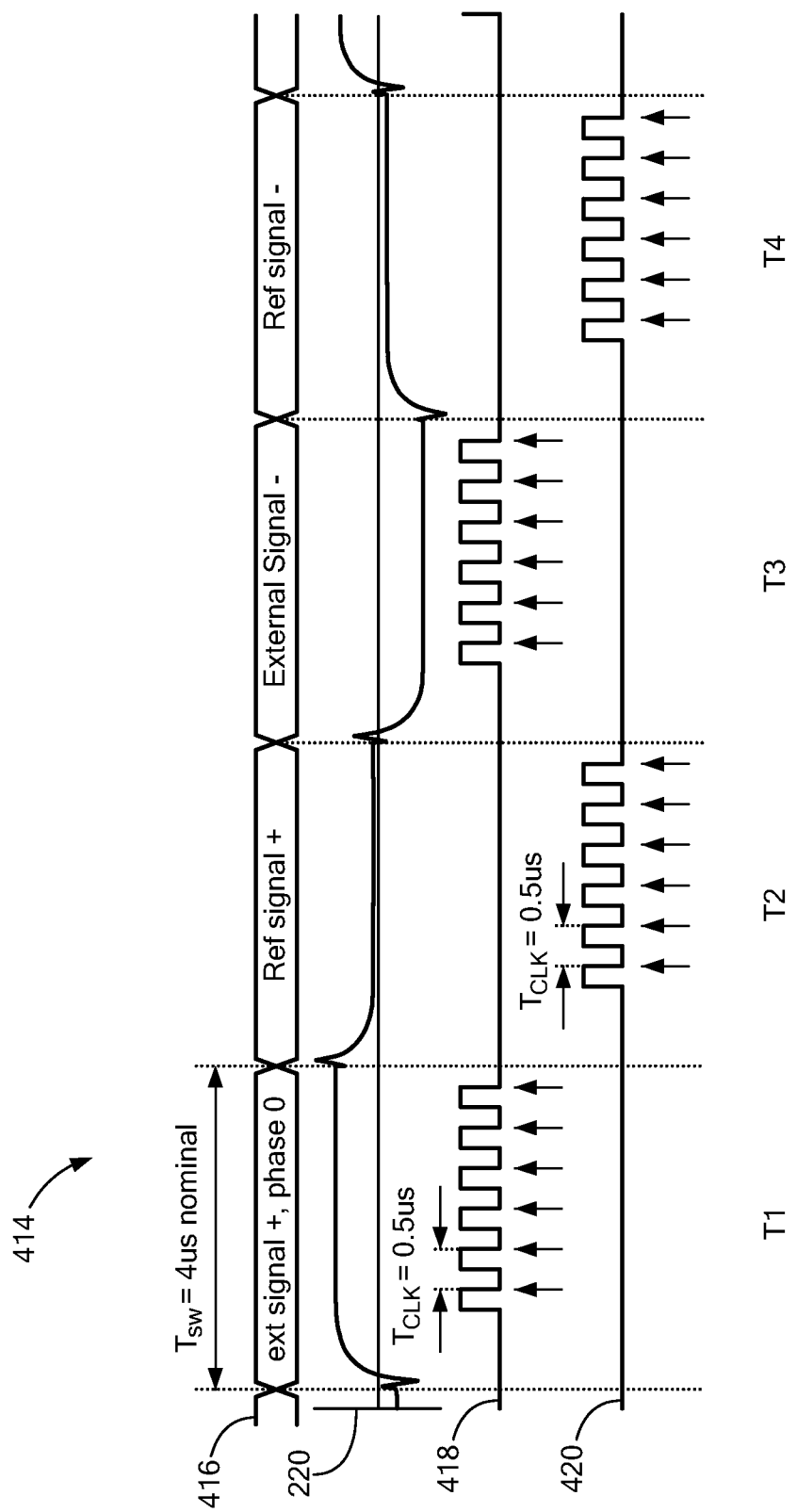
FIG. 5 is a timing diagram of signals related to the magnetic field sensor of FIG.

Referring to FIG. 5, a timing diagram 414 illustrates signals associated with circuit 200 of FIG. 2. Signal 416 illustrates the alternating time period. For example, time periods T1 and T3 correspond to a measured time period when circuit 200 is processing measured magnetic field signal 204, and time periods T2 and T4 correspond to a reference time period when circuit 200 is processing reference magnetic field signal 206. Amplified signal 220 shown in the timing diagram is the output signal produced by amplifier 214. Clock signals 418 and 420 are internal clock signals of ADC 222. Clock signal 418 is used to process measured magnetic field signal 204 and may be active during time periods T1 and T3. Clock signal 420 is used to process reference magnetic field signal 206 and may be active only time periods T2 and T4.

During time period T1, circuit 200 measures the external magnetic field 106. For example, multiplexor 208 may couple measured magnetic field signal 204 to the signal path during T1. Thus, during time period T1, signal 220 corresponds to measured magnetic field signal 204. Also during T1, converter circuit 234 is enabled and used by ADC 222 to convert signal 220 to a digital signal. During time period T2, circuit 200 measures the reference magnetic field produced by coil 216. For example, multiplexor 208 may couple reference magnetic field signal 206 to the signal path. Thus, during time period T2, signal 220 corresponds to reference magnetic field signal 206 during time period T2.

Although digital signal 224 is not shown in FIG. 5, digital signal 224 is a digital-signal version of amplified signal 220 and should follow amplified signal 220. In an embodiment, if reference signal 206 is a test signal with a known or expected value, then signal 220 and/or digital signal 224 can be compared to a test value or threshold to determine if there is a fault in circuit 200 in order to generate a diagnostic signal indicative of whether a fault is present. For example, a comparator or other circuit can compare signal 220 and/or signal 224 to a test threshold. If one or both of the signals fall outside a range of expected test values, for example, it may indicate a fault in circuit 200. Circuit 200 may also include a circuit that asserts a fault signal in the case of a fault. The fault signal may be received, for example, by computer 108 (FIG. 1) which may process and respond to the fault.

Figure 6:
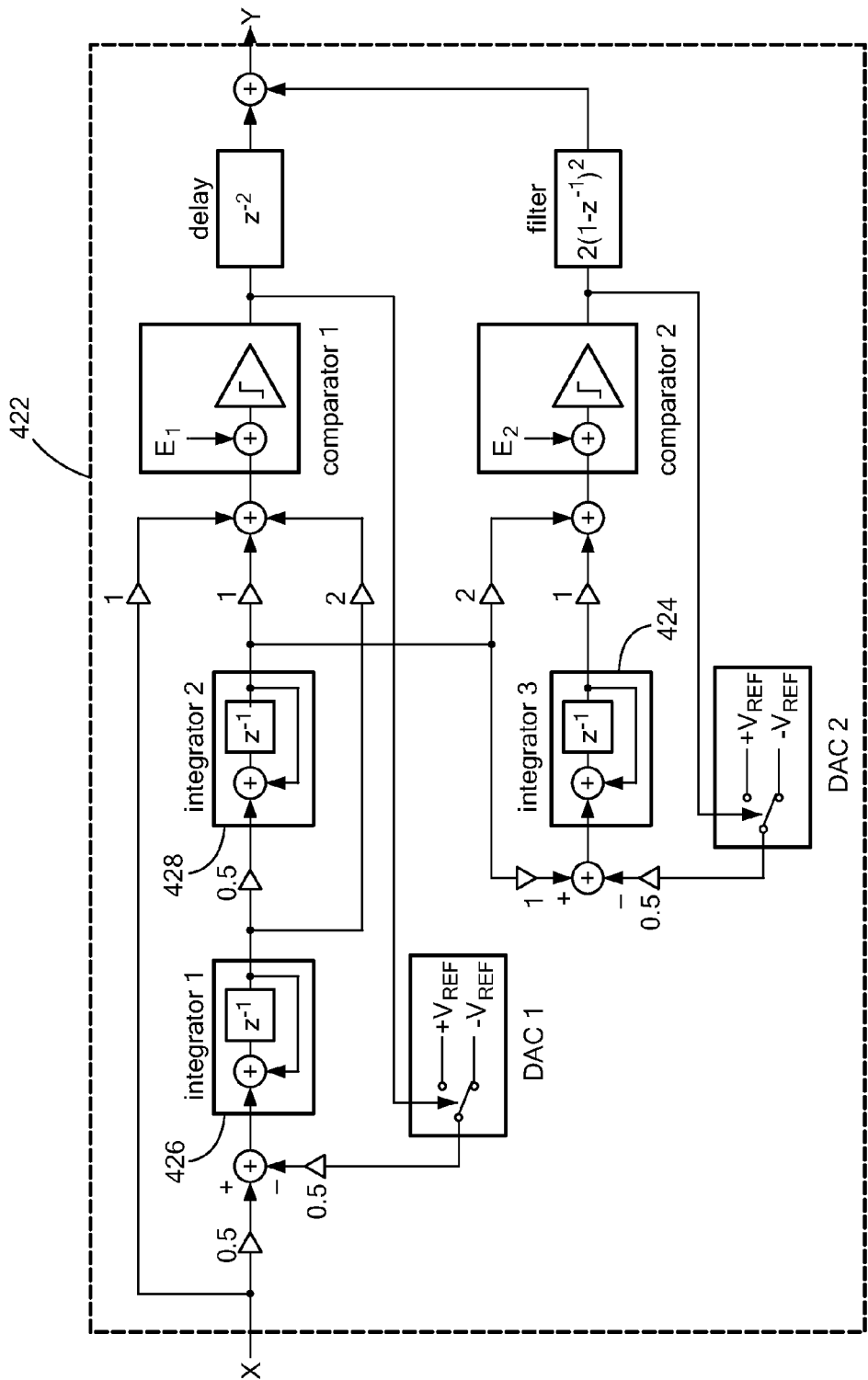
FIG. 6 is a block diagram of an analog-to-digital converter.

Referring to FIG. 6, ADC circuit 422 may be the same as or similar to ADC 222 in FIG. 2. In an embodiment, ADC 422 is a sigma-delta type analog-to-digital converter having one or more integrator circuits (e.g. integrator circuits 424, 426, and 428) as shown. However, ADC circuit 422 may be any type of analog-to-digital converter. Also, ADC 422 may be a so-called multi-path or dual-path analog-to-digital converter circuit. In other words, ADC 422 may include two or more signal paths including a first signal path for processing measured magnetic field signal 204 during a measured time period, and a second signal path for processing reference magnetic field signal 206 during a reference time period. In an embodiment, the two or more signal paths are located in at least one of the integrator circuits.

As mentioned above, the measured time period and the reference time period may be alternating time periods. Accordingly, the first signal path may be enabled (e.g. coupled to the main signal path) during the measured time period and disabled (e.g. decoupled from the main signal path) during the reference time period, and the second signal path may be disabled during the measured time period and enabled during the reference time period.

Figure 7:
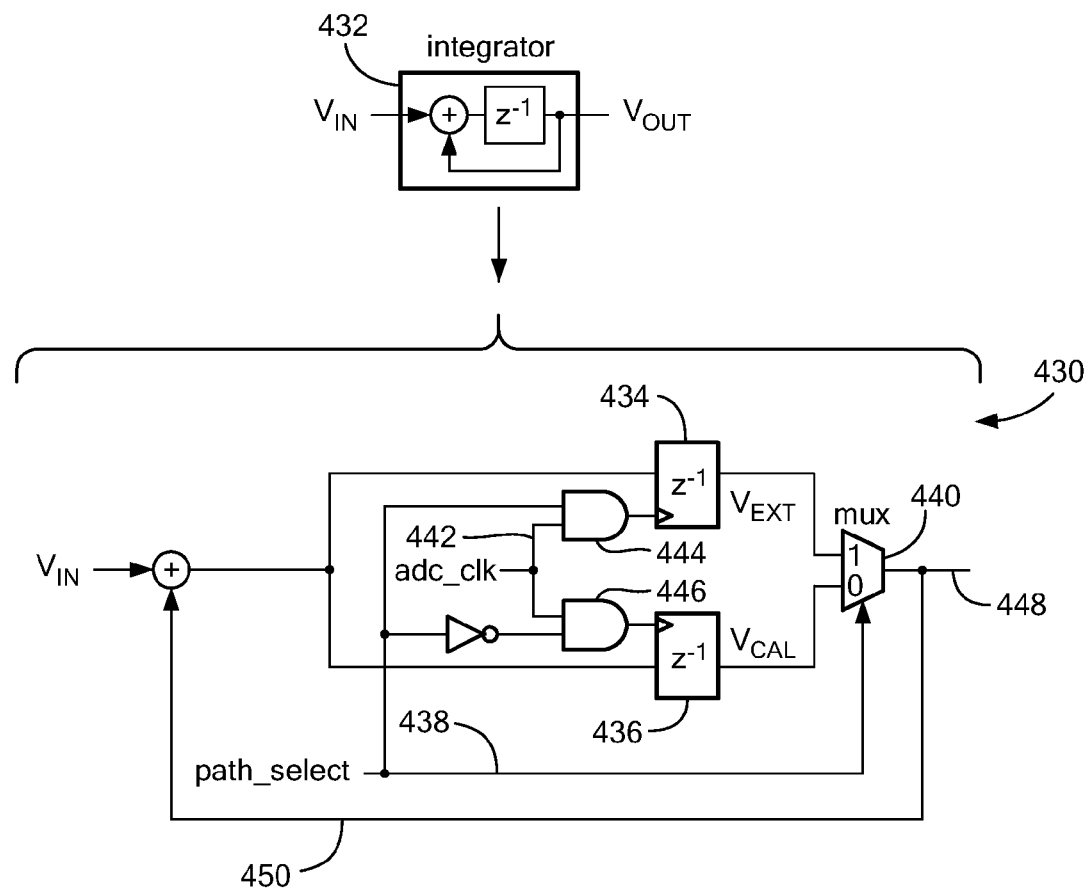
FIG. 7 is a functional block diagram of an integrator circuit.

Referring to FIG. 7, a functional block diagram 430 illustrates the operation of a dual-path or multi-path integrator circuit 432. Integrator circuit 432 may be the same as or similar to any or all of integrator circuits 424, 426, and 428.

Integrator circuit 432 may include a first signal path comprising converter circuit 434 and configured to process measured magnetic field signal 204, and a second signal path comprising converter circuit 436 and configured to process reference magnetic field signal 206. Converter circuits 434 and 436 may be the same as or similar to, or may form a portion of, converter circuits 234 and 236 in FIG. 2.

Converter circuits 434 and 436 may be analog memory elements formed by storing a voltage charge on a switched capacitor. Each integrator may be a discrete time operation circuit where the previous output state of the integrator is summed with the current input of the integrator to produce the next output state, as illustrated by feedback signal 450. Each integrator may have two or more analog memory elements, where each memory element can be used to process a different signal, and store a voltage charge associated with the signal while other signals are being processed.

As shown in FIG. 7, Integrator circuit 430 may include a path select signal 438, a multiplexor 440, a clock signal 442, and logic AND gates 444 and 446. Of course the logic gates can be replaced with any type of logic gates or switch with equivalent functionality.

In operation, path select signal 438 can be used to enable and disable converter circuits 434 and 436. When path select signal 438 is high, converter circuit 434 receives clock signal 442, converter circuit 436 is disabled because it does not receive the clock signal, and multiplexor 440 couples the output of converter circuit 434 to the output 448. When path select signal 438 is low, converter circuit 434 is disabled because it does not receive clock signal 442, converter circuit 436 is enabled because it receives clock signal 442, and multiplexor 440 couples the output of converter circuit 436 to the output 448. In an embodiment, path select signal 438 may be high during the measured time period to allow converter circuit 434 to process measured magnetic field signal 204, and low during the reference time period to allow converter circuit 436 to process reference magnetic field signal 206. Path select signal 438 can be inverted (e.g. high during the reference time period and low during the measured time period) in order to swap converter circuits 434 and 436 so they both receive test coverage, as described above.

Figure 8:
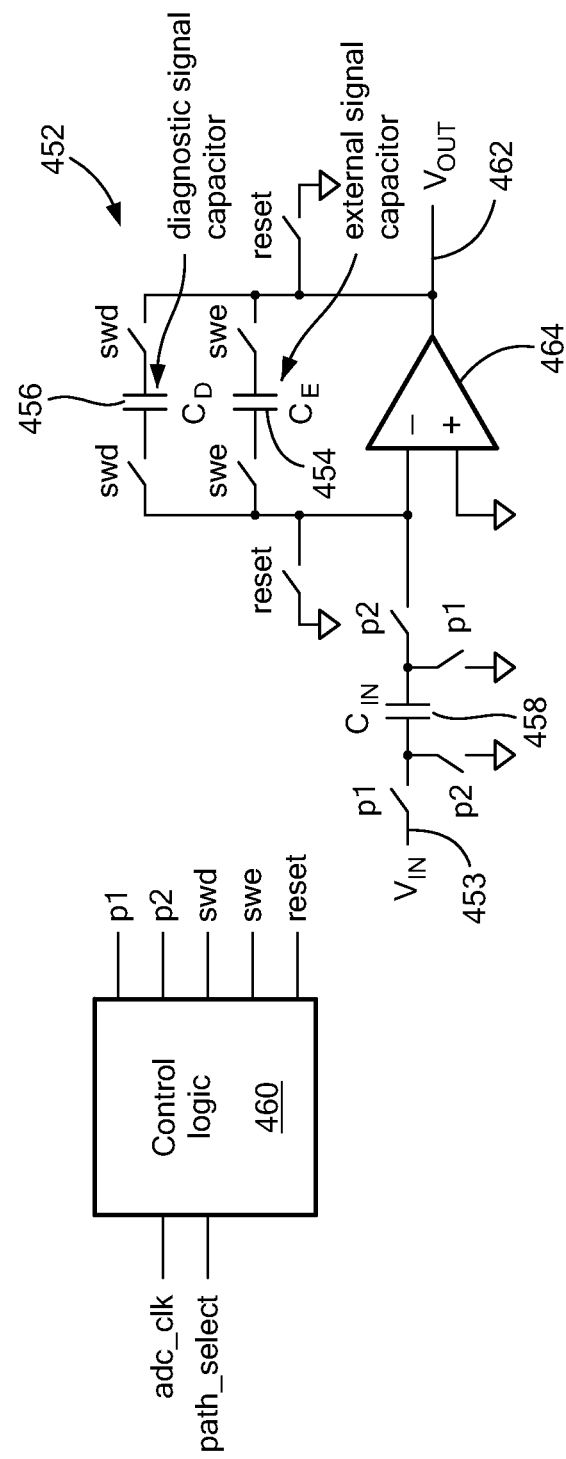
FIG. 8 is a circuit diagram of an integrator circuit.

Referring now to FIG. 8, a circuit diagram of an embodiment of an integrator circuit 452 is coupled to receive input signal 453 and produce output signal 462. Integrator circuit 452 may be an implementation or a subset of converter circuits 234 and 236. Integrator circuit 452 may also be the same as or similar to integrator circuit 432. Integrator circuit 452 includes a first signal path comprising one or more first capacitors 454, and a second signal path comprising one or more second capacitors 456. Note that while capacitors 454 and 456 are shown as single capacitors, it will be appreciated that capacitors 454 and/or 456 can be multiple capacitors coupled in series, in parallel, capacitors arranged in a differential configuration (i.e. to receive a differential signal), or in a combination of these.

Integrator circuit 452 may also have shared elements, such as operational amplifier 464, used to process both measured magnetic field signal 204 and reference magnetic field signal 206. In an embodiment, capacitors 454 are not shared circuit elements (i.e. are dedicated elements). Capacitors 454 may be configured to process measured magnetic field signal 204 during the measured time period, and capacitors 456 may be configured to process reference magnetic field signal 204 during the reference time period.

In an embodiment, a control circuit 460 controls switches swd to selectively couple and decouple capacitors 456 from the signal path, and controls switches swe to selectively couple and decouple capacitors 454 from the signal path. Control circuit 460 also controls switches p1 and p2 to selectively couple shared input capacitor 458 to the inverting input of the operational amplifier 464.

In operation, capacitors 454 are coupled to the signal path during the measured time period and decoupled from the signal path during the reference time period, and capacitors 456 are coupled to the signal path during the reference time period and decoupled from the signal path during the measured time period. In an embodiment, switches swd open and close at substantially the same time so that the voltage across capacitors 456 is retained while capacitors 456 are decoupled from the signal path, and switches swe open and close at substantially the same time so that the voltage across capacitors 454 is retained while capacitors 454 are decoupled from the signal path.

Figure 9:
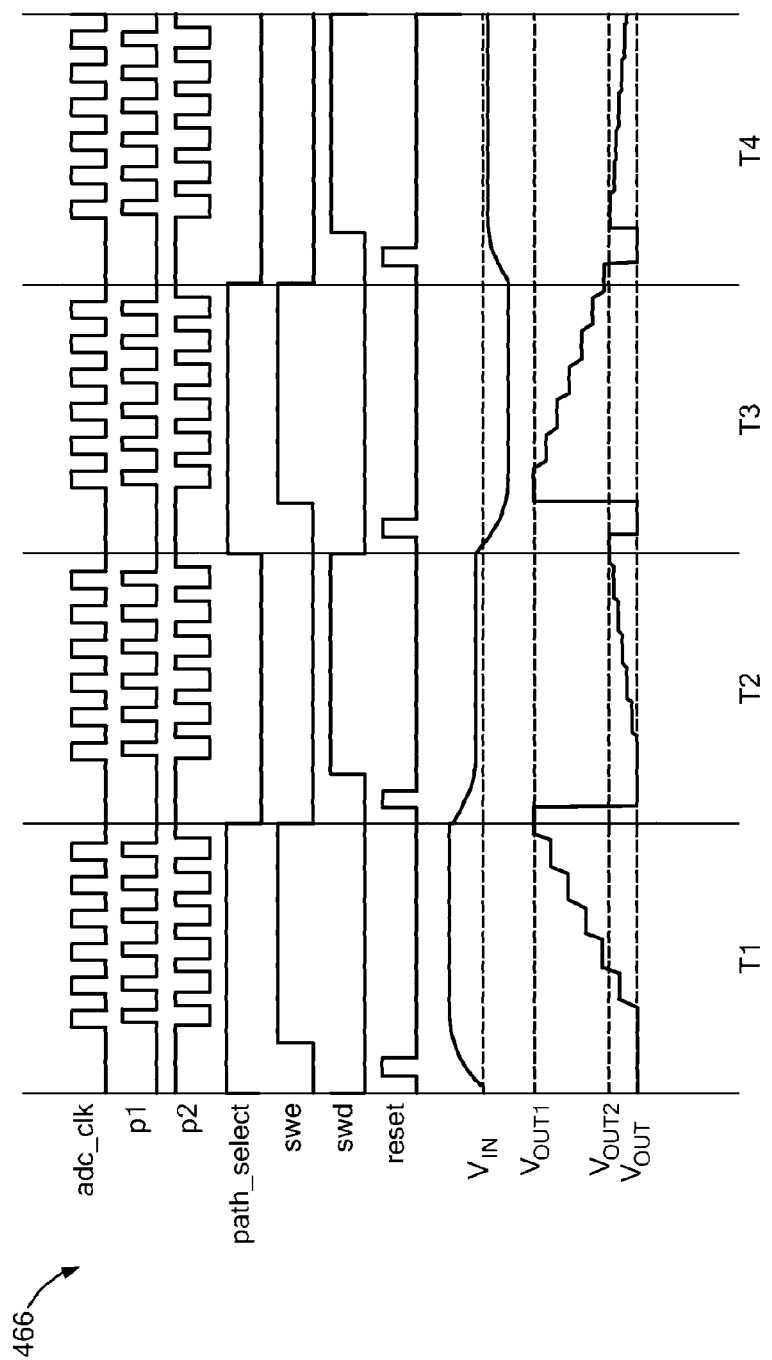
FIG. 9 is a timing diagram of signals related to the integrator circuit of FIG. 8.

Turning to FIG. 9, a timing diagram 466 includes signals associated with integrator circuit 452. Signals p1, p2, swe, and swd described above are shown. The signal labeled $V_{IN}$ may correspond to input signal 453 and the signal labeled $V_{OUT}$ may correspond to output signal 462.

Time periods T1 and T3 correspond to a measured time period during which integrator circuit 452 is processing measured magnetic field signal 204, and time periods T2 and T4 correspond to a reference time period during which integrator circuit 452 is processing reference magnetic field signal 206.

During period T1, signal swe is high so capacitors 454 are coupled to the signal path and signal swd is low so capacitors 456 are decoupled from the signal path. $V_{IN}$, which corresponds to the measured, external magnetic field 106 during time period T1, has a value greater than zero during period T1. As signals p1 and p2 couple and decouple input capacitor 458 to the inverting input of operational amplifier 464, the voltage across capacitors 454 will rise, as shown by the rising value of $V_{OUT}$ during time period T1.

During period T2, signal swe is low so capacitors 454 are decoupled from the signal path and signal swd is high so capacitors 456 are coupled to the signal path. In an embodiment, $V_{OUT}$ initially changes to the previous value stored on capacitors 456, which is zero in this example. $V_{IN}$, which corresponds to the reference magnetic field produced by coil 216 during time period T2, has a value greater than zero during time period T2. However, the amplitude of $V_{IN}$ during time period T2 is shown as lower than the amplitude during time period T1. In an embodiment, the lower amplitude may be due to the reference magnetic field having a relatively lower strength than the measured magnetic field 106. As signals p1 and p2 couple and decouple input capacitor 458 to the inverting input of operational amplifier 464, the voltage across capacitors 456 will rise, as shown by the rising value of $V_{OUT}$ during time period T1. As shown in the figure, $V_{OUT}$ may rise at a slower rate during time period T2 due to the lower signal value $V_{IN}$ during this time period.

During time period T3, when capacitors 454 are once again coupled to the signal path, the $V_{OUT}$ signal jumps to the same voltage level that it had at the end of time period T1. This is because the voltage across capacitors 454 was retained when capacitors 454 were decoupled from the signal path at the end of time period T1.

In time period T3, $V_{IN}$, which corresponds to the measured, external magnetic field 106 during time period T3, has a value less than zero during period T3. Thus, during time period T3, the voltage across capacitors 454 decreases as shown by the decreasing value of the $V_{OUT}$ signal.

During time period T4, when capacitors 456 are once again coupled to the signal path, the $V_{OUT}$ signal jumps to the same voltage level that it had at the end of time period T2. This is because the voltage across capacitors 456 was retained when capacitors 456 were decoupled from the signal path at the end of time period T2.

In time period T4, $V_{IN}$, which corresponds to the reference magnetic field produced by coil 216 during time period T4, has a value less than zero during period T4. Thus, during time period T4, the voltage across capacitors 456 decreases as shown by the decreasing value of the $V_{OUT}$ signal. In this example, the value of $V_{IN}$ may be smaller during T4 than it is when processing the measured, external signal during T3. Thus, the value of the $V_{OUT}$ signal may decrease at a relatively slower rate during T4 than it does during T3.

If the reference magnetic field is being used as a test signal, the voltage level across capacitors 456 (e.g. $V_{OUT}$ during time periods T2 and T4) can be compared to an expected value or expected threshold to generate a diagnostic output signal that can indicate whether a fault is present, for example. If $V_{OUT}$ falls outside of the threshold, a fault signal can be generated. In addition, the voltage level across capacitors 454, which corresponds to the measured magnetic field signal, can be processed to determine position, speed, direction, and other aspects of magnetic target 102.

In an embodiment, the output signal of ADC 222 has a shape and/or value that is the same as or similar to the input signal to the ADC. Filtering the output signal to remove high-frequency components can also shape the output signal so that it more closely resembles the input signal. Thus, the output signal from ADC 222 can be compared to the input signal during the reference time period and. If the output signal deviates from the input signal by a predetermined amount or threshold, then a fault signal can be generated indicating that a fault has been detected. Other methods of generating the fault signal can also be used.

In an embodiment, capacitors 454 and 456 can periodically be swapped, so that capacitors 454 are used to process the reference magnetic field signal 206 during time periods T2 and T4, and capacitors 456 are used to process the measured magnetic field signal 204 during time periods T1 and T2. This can ensure that both sets of capacitors are used at one time or another to process the reference magnetic field signal, so that both sets of capacitors receive test coverage. The sets of capacitors can be swapped according to a predetermined time schedule, in response to a command received by magnetic field sensor 104, or according to any other method that allows the sets of capacitors to be swapped. In an embodiment, control circuit 460 can swap capacitors 454 and 456 by swapping signals swe and swd.

In an embodiment, a reset signal (labeled as 'reset' in FIG. 9) is asserted between each transition between the measured and reference time periods. The reset signal may discharge any parasitic capacitors between each transition, and reduce or eliminate residual signals from the previous time period in order to reduce crosstalk and mixing between the measured and reference magnetic field signals.

Also, at the beginning of each transition between time periods, the clock signal (labeled 'adc_clk') may be paused for a settling time to allow the magnetic field sensors, amplifier, and other circuits time to settle. During this time, inputs and outputs of operational amplifier 464 may be reset and capacitors 454 and 456 may be disconnected, i.e. decoupled from operational amplifier 464. In an embodiment, capacitors 454 and 456 may also be reset if desired at power up or other times, by asserting the reset line while the capacitors are coupled to operational amplifier 464.

After the settling time, signal swe becomes high and the integrator 452 begins operation. Integrator operation includes sampling $V_{IN}$ from capacitor 458 and transferring charge from $C_{IN}$ to capacitor 454 (during the measured time period) or capacitor 456 (during the reference time period).

Thus, with each sample, integrator 452 adds a scaled version of the input signal to a previous output voltage level.

After a number of clock cycles, integrator 452 enters the reference time period and processes the reference signal. In an embodiment, the number of clock signals may be chosen to be large enough to allow for the settling time and for oversampling of the signal being processed, and small enough to prevent leakage currents from altering the voltage stored on the capacitor 454 or 456 that is disconnected from operational amplifier 464 and is not being processed. As shown in FIG. 9, the number of clock cycles is six. However, any number of appropriate clock cycles may be chosen.

Signal $V_{OUT}$ may be sampled and stored on capacitor 454 or 456 on the falling edge of the clock adc_clk. At the end of measured time period T1, the magnetic field sensing element may switch from a measured mode as shown in diagram 300 to a reference mode as shown in diagram 302 (See FIG. 3), and the inputs and outputs of operational amplifier 464 may be reset. At the rising edge of the swd signal, capacitor 456 may be coupled to operational amplifier 464 to allow integrator circuit 452 to process the reference magnetic field signal. As noted above, the slower rise in $V_{OUT}$ during time period T2 may be due to a smaller value of the diagnostic signal at $V_{IN}$, which may correspond to the reference magnetic field having a relatively lower strength. At the end of time period T2, integrator 452 may enter measured time period T3 and once again process the measured magnetic field signal 204 in the manner described above. Finally, as shown in FIG. 9, at the end of time period T3, integrator 452 may enter reference time period T4 and once again process the reference magnetic field signal 206 in the manner described above.

Figure 10:
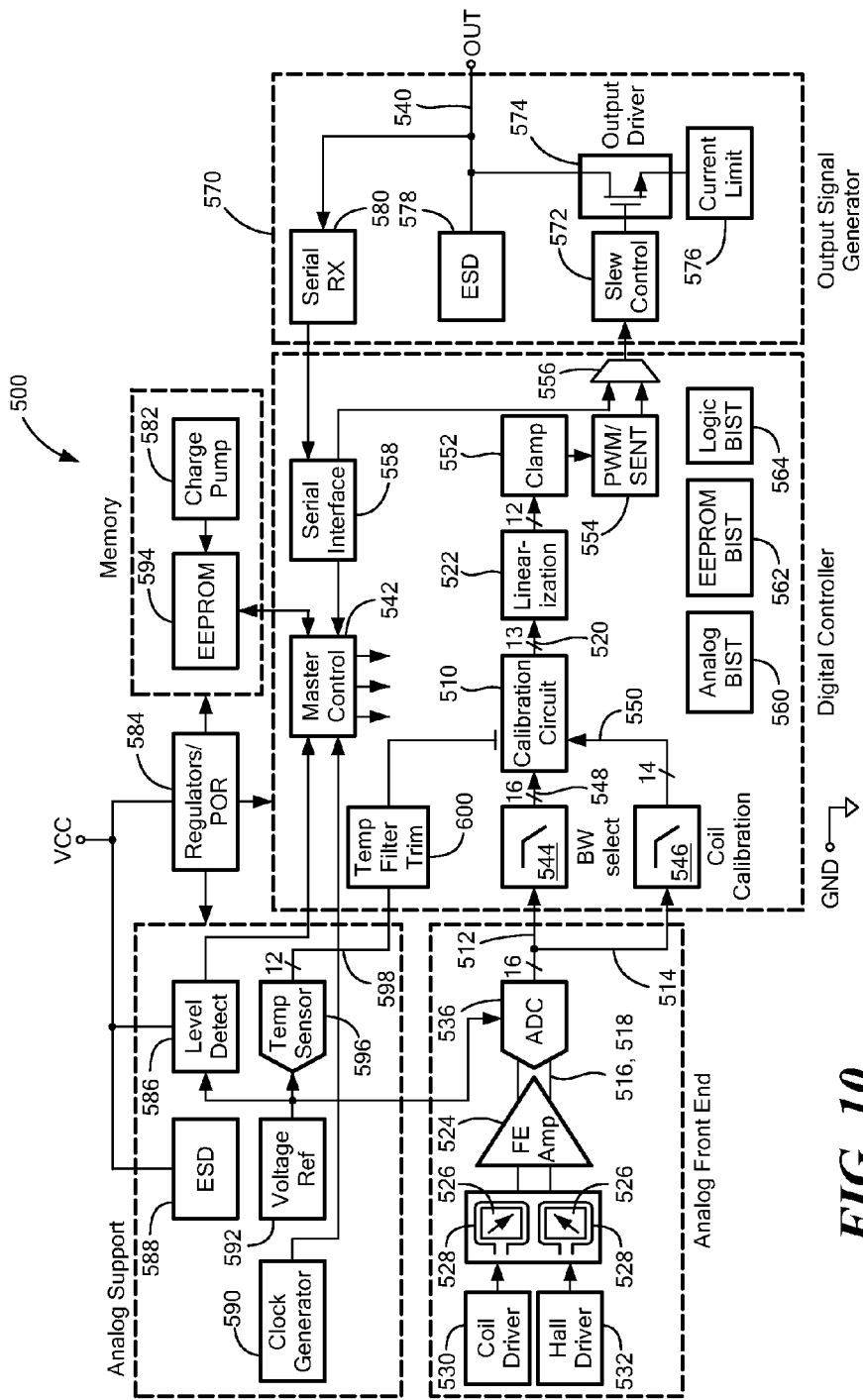
FIG. 10 is a block diagram of the magnetic field sensor including a calibration circuit.

Referring to FIG. 10, a magnetic field sensor 500 includes a calibration circuit 510 that is responsive to a digital measured magnetic field signal 512 and to a digital reference magnetic field signal 514 to generate a calibrated magnetic field signal 520. The calibrated magnetic field signal 520 is further processed to generate an output signal 540 of the sensor that is indicative of the external magnetic field.

The digital measured magnetic field signal 512 and the digital reference magnetic field signal 514 can be the same as or similar to signals 204 and 206 described above and thus, can be generated by switching between an external mode of operation in which a measured magnetic field signal 516 is generated by magnetic field sensing elements 526, such as the illustrated Hall effect elements, under the control of a Hall driver 532 and a reference mode of operation in which a reference magnetic field signal 518 is generated by a reference coil 528 under the control of a coil driver 530. The reference coil 528 is configured to carry a reference current to generate the reference magnetic field. At least one, and in the illustrated embodiment two, magnetic field sensing elements 526 are thus configurable to generate the measured magnetic field signal 516 during a first time period and to generate the reference magnetic field signal 518 during a second, non-overlapping time period.

As described above, the measured magnetic field signal and the reference magnetic field signal may be processed by a Front End (FE) amplifier 524 that may be the same as or similar to amplifier 214 of FIG. 2 and converted into respective digital signals 512, 514 by an analog-to-digital converter 536 using a fixed reference from a voltage reference 592, which converter 536 can be the same as or similar to converter 222 of FIG. 2.

The digital measured magnetic field signal 512 is filtered by a filter 544 to provide a filtered digital measured magnetic field signal 548 (referred to herein alternatively as the digital measured magnetic field signal) and the digital reference magnetic field signal 514 is filtered by a filter 546 to provide a filtered reference magnetic field signal 550 (referred to herein alternatively as the digital reference magnetic field signal). In general, the digital measured magnetic field signal 512 has a larger amplitude than the digital reference magnetic field signal 514 and thus, filter 546 provides a higher degree of filtering than filter 544 to more accurately distinguish the reference magnetic field signal in the presence of noise. Various types of filters are possible. As one example, each of the filters 544, 546 is a decimation low pass FIR filter.

The calibration circuit 510 is configured to combine the digital measured magnetic field signal 548 and the digital reference magnetic field signal 550 in a manner that generates the calibrated magnetic field signal 520 with a reduced or eliminated dependence on certain influences on the magnetic field sensor 500. For example, in the case of an integrated circuit magnetic field sensor 500, certain mechanical stresses on the package due to temperature and humidity variations can cause the sensor output signal 540 to vary from its nominal, trimmed value for a given external magnetic field, thereby adversely affecting the accuracy of the sensor. Operation of the calibration circuit 510 may be controlled by a master control circuit 542 (which additionally may control various other circuit functionality) and will be described in greater detail in connection with FIGS. 11-13. Suffice it to say here that the calibration circuit 510 operates on the digital measured magnetic field signal 548 in a manner dependent on the digital reference magnetic field signal 550 to provide the calibrated signal 520 with a reduced or eliminated dependence on certain adverse influences.

The calibrated magnetic field signal 520 may be processed by a linearization circuit 522 in certain applications. As one example, the calibrated signal 520 may be transformed into a signal representative of a position of a target by correlating values of the calibrated signal to values stored in a lookup table. The output of the linearization circuit 522 may be clamped by a clamp 552 to limit the output to a programmable range and further processed by a PWM/SENT encoder circuit 554 to generate a signal having a PWM format with a programmable frequency or a SENT signal format. A multiplexer 556 can be used to select between providing the output of the PWM/SENT circuit 554 or an output of a serial interface circuit 558 to an output signal generator 570.

Additional elements of the magnetic field sensor 500 can include an analog Built-in-Self-Test (BIST) circuit 560 as may implement the above-described techniques for diagnostic signal processing to detect errors in the analog front end of the sensor, an EEPROM BIST circuit 562 to test the EEPROM 594, and a logic BIST circuit 564 to test various logic functionality on the sensor IC 500.

The output signal generator 570 is coupled to the multiplexer 556 and includes various elements used to reliably generate the sensor output signal 540 indicative of the external magnetic field, such as a slew control circuit 572, an output driver 574, a current limit circuit 576, an ESD protection device 578, and a serial Receiver (RX) circuit 580. In applications in which the output signal 540 is provided in the SENT signal format, the serial receiver 580 may implement bidirectional communication as described in a U.S. Pat. No. 8,577,634, entitled "Systems and Methods for Synchronizing Sensor Data" which is assigned to the assignee of the present disclosure and incorporated herein by reference in its entirety. The sensor 500 may further include additional supporting elements such as an EEPROM 594, a charge pump 582, a regulator and Power On Reset (POR) circuit 584, a level detector 586, an ESD protection device 588 and, a clock generator 590.

A temperature sensor 596 senses the ambient temperature to which the sensor is subjected, converts the sensed temperature into a digital signal, and provides the digital sensed temperature signal 598 to a temperature filter and trim circuit 600 for further coupling to the calibration circuit 510 as described below.

While the sensor 500 may be provided in the form of an integrated circuit with an analog front end portion and a digital portion, it will be appreciated that the particular delineation of which circuit functions are implemented in an analog fashion or with digital circuitry and signals can be varied. Further, some of the illustrated circuit functions can be implemented on an integrated circuit sensor 500 and other circuitry and functionality can be implemented on separate circuits (e.g., additional substrates within the same integrated circuit package, or additional integrated circuit packages, and/or on circuit boards).

Figure 11:
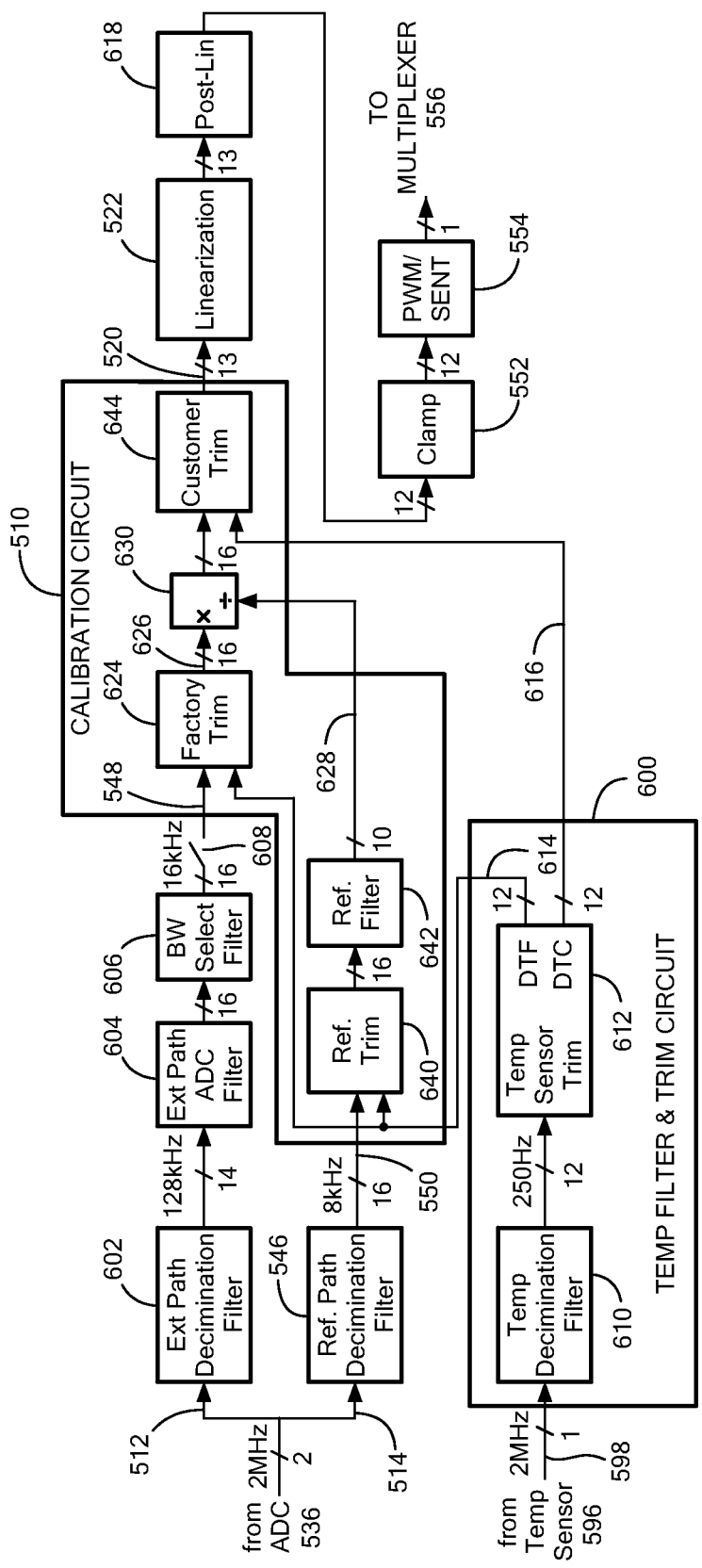
FIG. 11 is a block diagram of the controller of FIG. 10.

Referring also to FIG. 11 in which like elements are labeled with like reference characters, the calibration circuit 510 and certain other elements of the sensor of FIG. 10 are shown. In particular, the filter 544 (FIG. 10) that operates to filter the digital measured magnetic field signal 512 to provide the filtered digital measured magnetic field signal 548 is here shown to include a decimation filter 602, an ADC filter 604, and a bandwidth select filter 606, each providing low-pass filtering to reduce noise. In an embodiment, filter 602 decimates a 2 MHz ADC signal to 128 kHz and provides some low-pass filtering. Slower (i.e., 128 kHz) processing consumes less power and silicon area. Filter 604 provides additional low-pass filtering beyond what is feasible with the decimation filter 602 and filter 606 provides additional low-pass filtering that is selectable by the customer in order to permit a trade-off to be made between noise performance and response time. The reference path filter 546 (FIG. 10) that operates to filter the digital reference magnetic field signal 514 to provide the filtered digital reference magnetic field signal 550 may be a decimation filter. The output of the bandwidth select filter 606 provides the filtered digital measured magnetic field signal 548 and is shown to be coupled to the calibration circuit 510 through a switch 608. The switch 608 illustrates that in some embodiments, sampling of the signal 548 may be at a predetermined sample rate, such as the illustrated 16 kHz, or alternatively may be at a different rate such as in response to an external trigger signal as described in the above-referenced U.S. Pat. No. 8,577,634, for example.

The temperature filter and trim circuit 600 is here shown to include a temperature decimation filter 610 and a temperature sensor trim circuit 612. The temperature sensor trim circuit 612 provides a trimmed factory temperature signal 614 for use by a factory trim circuit 624 and a reference trim circuit 640. The temperature sensor trim circuit also provides a trimmed customer temperature signal 616 for use by a customer trim circuit 644. Various schemes are possible to trimming the temperature signal 598.

A post-linearization circuit 618 can be coupled between the linearization circuit 522 to introduce additional gain and offset trim, as may be useful to attenuate the signal to maintain usage of all linearization points when using an output range that is not full-scale for example.

The calibration circuit 510 receives the digital measured magnetic field signal 548, the digital reference magnetic field signal 550, and the trimmed temperature signals 614, 616 and generates the calibrated signal 520, as shown. More particularly, the calibration circuit 510 includes factory trim circuit 624 (referred to alternatively as a manufacturing trim circuit) that receives the digital measured magnetic field signal 548 and the trimmed temperature signal 614 and is configured to adjust at least one of a gain or an offset of the digital measured magnetic field signal based on a sensed temperature (i.e., based on the trimmed temperature signal 614). More particularly, the factory trim circuit 624 corrects for analog front end gain and offset variations due to temperature, such as by adding a temperature-dependent offset and multiplying by a temperature-dependent gain factor, which factors may be programmed during a manufacturing test process. The factory trim circuit 624 may additionally correct for temperature-independent offset and gain errors in the analog front end signal path. Programmable trim values associated with the factory trim circuit and any other trim circuits can be programmed into EEPROM locations 594.

The calibration circuit 510 further includes a reference trim circuit 640 that receives the digital reference magnetic field signal 550 and the trimmed temperature signal 614 and provides a trimmed reference magnetic field signal to a reference filter 642.

The reference trim circuit 640 is configured to adjust a gain of the reference magnetic field signal 550. In one embodiment, the reference trim circuit 640 adjusts a gain of the digital reference magnetic field signal based on a predetermined scale factor to facilitate signal processing by a combining circuit 630, as will be described. The reference trim circuit 640 may further adjust at least one of the gain or an offset of the digital reference magnetic field signal based on a sensed temperature (i.e., based on trimmed temperature signal 614) in a manner that is the same as or similar to the factory trim circuit 624. For example, the reference trim circuit 640 may correct for analog front end gain and offset variations due to temperature by adding a temperature-dependent offset and multiplying by a temperature-dependent gain factor, which factors may be programmed during a manufacturing test process. The reference trim circuit 640 may additionally correct for temperature-independent offset and gain errors in the analog front end signal path. Again, programmable trim values can be programmed into EEPROM locations 594.

The combining circuit 630 is configured to combine the digital measured magnetic field signal 548 and the digital reference magnetic field signal 550 and, more particularly, may operate to combine the trimmed version of these signals as labeled 626, 628, respectively, as shown. In an embodiment general, the combining circuit 630 divides the measured magnetic field signal 626 by the reference magnetic field signal 628. The division operation can be accomplished in various ways. In the illustrative embodiment, a Taylor series expansion is used as will be described.

The output of the combining circuit 630 may be further trimmed by a customer trim circuit 644 in order to generate the calibrated magnetic field signal 520. The customer trim circuit 644 may be divided into a sensitivity trim portion which multiplies the input signal by a user programmable temperature-dependent gain factor and an offset portion that adds to its input a user programmable offset that is linearly dependent on temperature as a function of magnetic field strengths and offsets in the customer's application. Further processing of the calibrated signal 520 may be performed by linearization circuit 522, post-linearization circuit 618, clamp 552 and PWM/SENT encoder 554 (FIG. 10).

Figure 12:
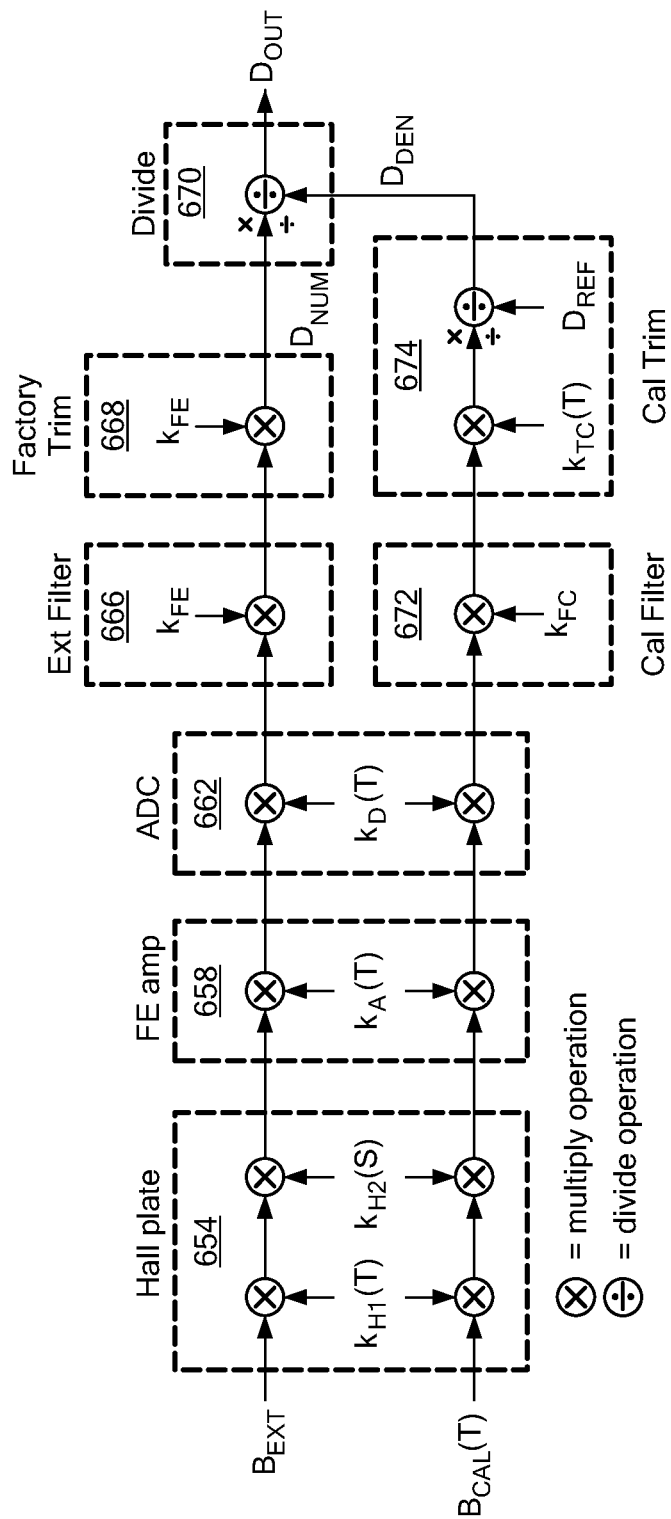
FIG. 12 is block diagram illustrating a mathematical model of the magnetic field sensor of FIG. 10.

Referring also to FIG. 12, a model of the magnetic field sensor 500 (FIGS. 10 and 11) is shown to illustrate the principle of operation of the combining circuit 630. As explained above, much of the sensor circuitry is shared between sensing and processing a magnetic field signal based on an external magnetic field $B_{EXT}$ and sensing and processing a magnetic field signal based on a reference magnetic field $B_{CAL}$; however, for simplicity of explanation, these two signal processing functions are shown in the model of FIG. 12 as being separate signal paths.

The one or more magnetic field sensing elements 526 (FIG. 10) are represented by model block 654 as being responsive to an external magnetic field $B_{EXT}$ and a reference magnetic field $B_{CAL}$ as may be provided by a reference coil 528 (FIG. 10) for example. The reference magnetic field $B_{CAL}$ is modeled as a function of temperature (T) because it is generated by temperature-sensitive components. The magnetic field sensing element is modeled with a temperature-dependent sensitivity $k_{H1}(T)$ and a stress-dependent sensitivity multiplier of $k_{H2}(S)$, where "S" represents mechanical stress. Here, $k_{H2}(S)$ represents the percentage change in nominal sensing element sensitivity $k_{H2}$ due to stress, which is typically less than 3%. In other words, typically $0.97<k_{H2}(S)<1.03$.

The amplifier 524 and analog-to-digital converter 536 (FIG. 10) are modeled by respective blocks 658 and 662, each having a temperature-dependent gain $k_A(T)$ and $k_D(T)$, respectively. The external filter 544 (FIG. 10) and the reference filter 546 (FIG. 10) are modeled by respective blocks 666 and 672, each having a temperature-independent gain parameter $k_{FE}$ and $k_{FC}$, respectively.

The factory trim circuit 624 (FIG. 11) is modeled by a block 668 as having a temperature dependent gain $k_{TE}(T)$. The reference trim circuit 640 (FIG. 11) is modeled by a block 674 and includes a temperature dependent gain term $k_{TC}(T)$. Block 674 includes an additional term $D_{REF}$ to represent a gain adjustment by a predetermined reference value, or scale factor used to facilitate operation of the combining circuit 630 (FIG. 11). Reference value $D_{REF}$ may be chosen to be an exponent of two to facilitate a simple division operation (i.e., a bit-shift operation) by the reference trim circuit 640.

The combining circuit 630 (FIG. 11) is modeled by a block 670 and is shown to compute $D_{OUT}$, the quotient of the measured magnetic field signal 626 and the reference magnetic field signal 628, for further signal processing. $D_{OUT}=D_{NUM}/D_{DEN}$ can be represented as:

$$= \frac{k_{FE} \cdot k_{H1}(T) \cdot k_A(T) \cdot k_D(T) \cdot k_{TE}(T) \cdot k_{H2}(S) \cdot B_{EXT}}{k_{FC} \cdot k_{H1}(T) \cdot k_A(T) \cdot k_D(T) \cdot k_{TC}(T) \cdot k_{H2}(S) \cdot B_{EXT}(T)/D_{REF}} \quad (1)$$

As noted above, the trim circuits 624, 640 are designed to reduce or remove the temperature dependence of the output signal. Accordingly, the $k_{TE}(T)$ and $k_{TC}(T)$ can be chosen so that:

$$k_{TE}(T) \approx k_{NOM} \cdot [k_{FE} \cdot k_{H1}(T) \cdot k_A(T) \cdot k_D(T)]^{-1} \quad (2)$$

$$k_{TC}(T) \approx D_{REF} \cdot [k_{FC} \cdot k_{H1}(T) \cdot k_A(T) \cdot k_D(T) \cdot B_{EXT}(T)]^{-1} \quad (3)$$

where $k_{NOM}$ is the nominal, or desired, sensitivity of the sensor, independent of temperature and stress. More particularly, $k_{NOM}$ defines how many LSBs the device output should change by in the presence of an input magnetic field change of 1 Gauss. According to equation (2), if the combined effect of the front-end parameters (which may be measured during manufacture) is known, then $k_{TE}$ (as a function of temperature) can be selected to make the sensitivity become $k_{NOM}$, as desired. A similar methodology can be used to select $k_{TC}$. Substituting the latter expressions into the former and solving for $D_{OUT}$ gives:

$$D_{OUT} = \frac{D_{NUM}}{D_{DEN}} \approx \frac{k_{NOM} \cdot k_{H2}(S) \cdot B_{EXT}}{k_{H2}(S)} = k_{NOM} \cdot B_{EXT} \quad (4)$$

Thus, it will be appreciated that $D_{OUT}$ becomes the desired response, with desired sensitivity $k_{NOM}$, independent of temperature (T) and stress (S).

The model of FIG. 12 includes only operations that adjust the gain of the measured and reference signals. Temperature-dependent offsets also exist in the system, both as generated by inaccurate analog circuit components and as included for compensating for inaccurate analog circuit components by factory and reference trim blocks. These effects are not included in the model to simplify the above analysis. It will be appreciated that these offset errors can be cancelled in a similar way to the sensitivity error cancellations shown in Equations (2) through (4) above, resulting in a sensor output signal $D_{OUT}$ that remains independent of stress effects.

The division operation performed by the combining circuit 630 (FIG. 11) can be simplified by forcing the divisor to be numerically close to one (e.g., within about 3%) as is achieved by the reference trim circuit 640 adjusting the gain of the reference magnetic field signal by the predetermined scale factor $D_{REF}$. In particular, in one embodiment, the combining circuit 630 performs a division operation using a Taylor series expansion that can be represented as follows:

$$D_{OUT} = \frac{D_{NUM}}{D_{DEN}} = \frac{D_{NUM}}{1-(1-D_{DEN})} = \quad (5)$$
$$D_{NUM} \cdot [1 + (1-D_{DEN}) + (1-D_{DEN})^2 + (1-D_{DEN})^3 + \ldots ]$$

This expansion can be approximated with only a few terms if $(1-D_{DEN})$ is numerically small relative to one. This is indeed the case, as $1-D_{DEN}=1-k_{H2}(S)$, which represents the percentage change of the Hall plate sensitivity due to stress, is typically less than 0.03 (3%) in magnitude, in other words, $-0.03<1-k_{H2}(S)<+0.03$.

In particular, the division operation can be expressed with sufficient accuracy for most applications by using only three terms as follows:

$$D_{OUT} \approx D_{NUM}[1+(1-D_{DEN})+(1-D_{DEN})^2+(1-D_{DEN})^3]$$

$$D_{OUT} \approx D_{NUM}[1+X \cdot (1+X \cdot (1+X))] \quad (6)$$

where $X=(1-D_{DEN})$. This simplification is possible because the reference trim circuit 640 forces $D_{DEN} \approx 1$, thereby ensuring that the three terms used in the Taylor series approximation provide a resulting calibrated signal 520 that is accurate enough to track small changes in $D_{DEN}$ due to stresses.

Figure 13:
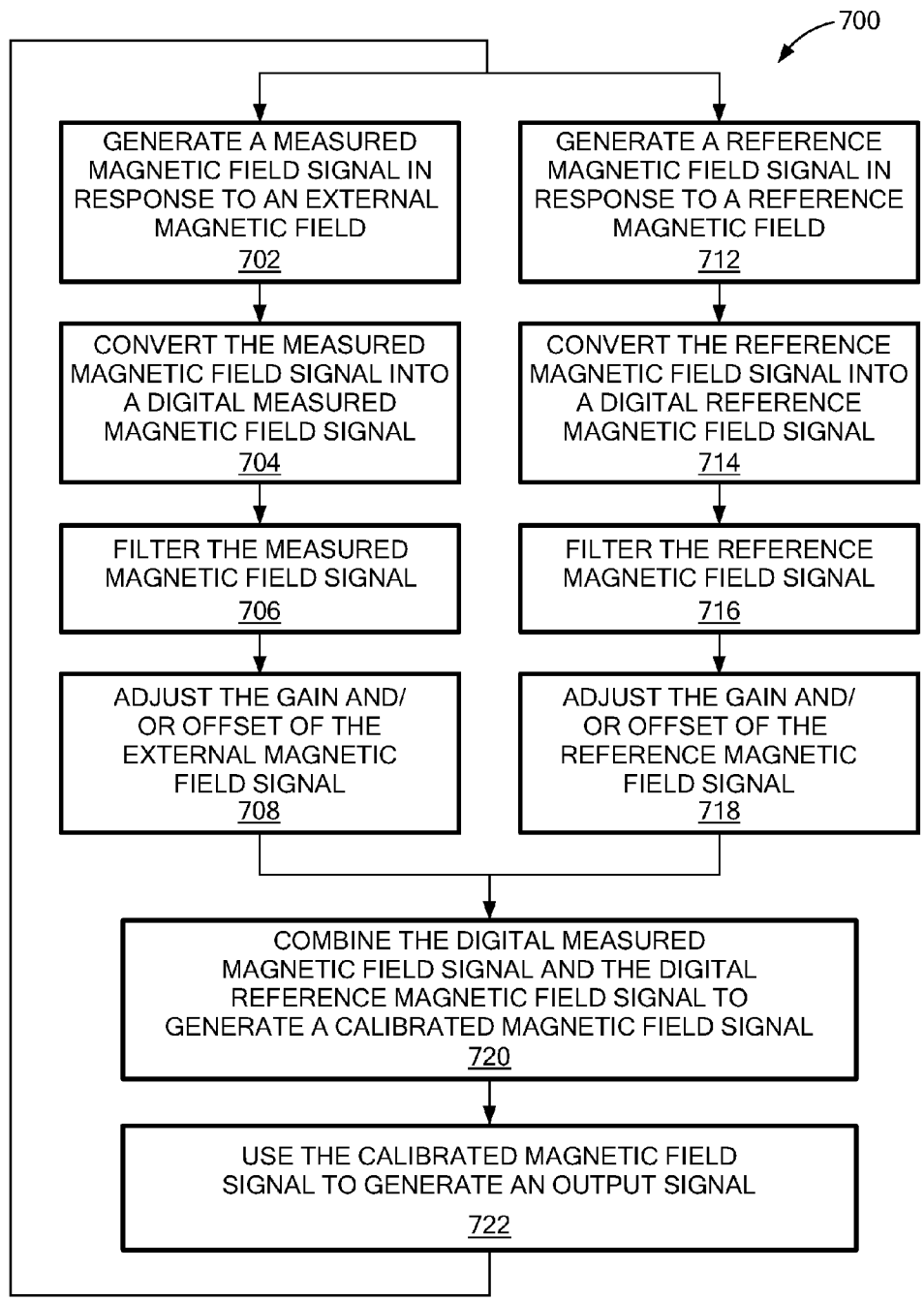
FIG. 13 is a flow diagram illustrating a calibration process of the magnetic field sensor of FIG. 10.

In one embodiment, the computation represented by equation (6) can be implemented with a single shared multiplier, used three times. FIG. 13 shows a flowchart illustrating a process for implementing the magnetic field sensor 500 (FIGS. 10 and 11) to calibrate a measured magnetic field signal. Rectangular elements, herein denoted "processing blocks," represent computer software instructions or groups of instructions. Diamond shaped elements, herein denoted "decision blocks," represent computer software instructions, or groups of instructions, which affect the execution of the computer software instructions represented by the processing blocks. Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated file blocks described below are unordered meaning that, when possible, the steps can be performed in any convenient or desirable order.

The process 700 commences with a measured magnetic field signal (e.g., signal 516 of FIG. 10) being generated in response to an external magnetic field at block 702, as may be achieved with the Hall effect elements 526 configured to respond only to an external magnetic field. A reference magnetic field signal (e.g., signal 518 of FIG. 10) is generated in response to a reference magnetic field at block 712, as may also be achieved with the Hall effect elements 526 configured to respond to reference magnetic field such as the reference magnetic field generated by reference coil 528. With the above-described configuration, the magnetic field sensing elements 526 are configured to generate the measured magnetic field signal 516 during a first timer period and to generate the reference magnetic field signal 518 during a second, non-overlapping time period.

The measured and reference magnetic field signals are converted to digital signals (e.g., signals 512, 514 of FIG. 10) in process blocks 704 and 714, respectively, as may be achieved with the analog-to-digital converter 536 (FIG. 10), and the measured and reference magnetic field signals may be filtered in blocks 706, 716, respectively, by filters 544, 546 (e.g., to provide signals 548, 550 of FIG. 10). In process block 708, at least one of a gain or offset of the external magnetic field signal 548 may be adjusted, such as by factory trim circuit 624 (FIG. 11). In process block 718, a gain of the reference magnetic field signal 550 may be adjusted by a predetermined scale factor and also or alternatively a gain or offset of the reference magnetic field signal 550 may be adjusted, such as by reference trim circuit 640 (FIG. 11). The digital measured magnetic field signal 626 and the digital reference magnetic field signal 628 are combined to generate a calibrated magnetic field signal in block 720, such as may be achieved by combining circuit 630 (FIG. 11). Accordingly, in one embodiment, the digital measured magnetic field signal 626 is divided by the digital reference magnetic field signal 628. It will be appreciated that other schemes for combining the digital measured magnetic field signal 626 and the digital reference magnetic field signal 628 may be possible in order to still achieve the reduction or elimination of stress influences on the generated calibrated signal. As an example, simple addition and/or subtraction can be used. That is, taking an example where the reference signal 628 is 2% greater than its expected value, the 2% can be subtracted from the measured signal 626. In process block 722, the calibrated magnetic field signal (e.g., signal 520 in FIG. 10) is used to generate the sensor output signal (e.g., signal 540 in FIG. 10).

The calibration process 700 may be performed at any time since the related circuitry and processing is integrated within the sensor 500 (e.g., on an integrated circuit sensor 500). Furthermore, the process steps may be performed together or in stages. For example, some portions of the signal processing may be performed during the manufacturing process (e.g., processing performed by the factory trim circuit 624, the customer trim circuit 644, the reference trim circuit 640, and/or the temperature sensor trim circuit 612) while other signal processing (e.g., the signal combining by combining circuit 630) may be performed periodically or in response to a command signal during use of the sensor after it is installed in the intended environment.

It will be appreciated that processing blocks illustrated in FIG. 13 may occur simultaneously rather than sequentially and that the illustrated sequence can be varied in many instances. As one example, while the calibration circuit 510 (FIGS. 10 and 11) is shown to process the measured and reference magnetic field signals in the digital domain (after the analog-to-digital conversion by converter 536, it will be appreciated that the same calibration concepts can be applied in the analog domain. For example, the division performed by the combining circuit 630 alternatively could be performed in the analog domain with the use of an analog-to-digital converter that has as its input the measured magnetic field signal 516 (FIG. 10) and as its reference the reference magnetic field signal 518. In such embodiments, it will be appreciated the analog-to-digital conversion blocks 704, 714 in FIG. 13 can occur later in the process, after the measured magnetic field signal is divided by the reference magnetic field signal.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

All references cited herein are hereby incorporated herein by reference in their entirety.

Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor, comprising:
   at least one magnetic field sensing element configured to generate a measured magnetic field signal responsive to and representing an external magnetic field and to generate a reference magnetic field signal responsive to and representing a reference magnetic field;
   at least one analog-to-digital converter responsive to the measured magnetic field signal to generate a digital measured magnetic field signal and responsive to the reference magnetic field signal to generate a digital reference magnetic field signal; and
   a calibration circuit responsive to the digital measured magnetic field signal and to the digital reference magnetic field signal to combine the digital measured magnetic field signal and the digital reference magnetic field signal in order to generate a calibrated magnetic field signal that represents the external magnetic field;
   wherein the calibration circuit comprises a divider configured to divide the digital measured magnetic field signal by the digital reference magnetic field signal to generate the calibrated magnetic field signal.

2. The magnetic field sensor of claim 1 wherein the divider comprises a multiplier configured to generate the calibrated magnetic field signal based on a Taylor series expansion.

3. The magnetic field sensor of claim 1 further comprising a reference coil proximate to the at least one magnetic field sensing element, wherein the reference coil is configured to carry a reference current to generate the reference magnetic field.

4. The magnetic field sensor of claim 1 wherein the at least one magnetic field sensing element is configurable to generate the measured magnetic field signal during a first time period and to generate the reference magnetic field signal during a second, non-overlapping time period.

5. The magnetic field sensor of claim 1 wherein the at least one magnetic field sensing element comprises a Hall effect element.

6. The magnetic field sensor of claim 1 wherein the at least one magnetic field sensing element comprises a magnetoresistance element.

7. The magnetic field sensor of claim 1 further comprising a built in built-in self-test circuit configured to detect an error in the magnetic field sensor.

8. The magnetic field sensor of claim 1 further comprising an output signal generator responsive to the calibrated magnetic field signal to generate an output signal of the magnetic field sensor indicative of the external magnetic field.

9. The magnetic field sensor of claim 1 wherein the calibration circuit comprises a manufacturing trim circuit configured to adjust at least one of a gain or an offset of the digital measured magnetic field signal based on a sensed temperature.

10. The magnetic field sensor of claim 1 wherein the calibration circuit comprises a calibration trim circuit configured to adjust a gain of the digital reference magnetic field signal based on a predetermined scale factor.

11. The magnetic field sensor of claim 10 wherein the calibration trim circuit is further configured to adjust at least one of the gain or an offset of the digital reference magnetic field signal based on a sensed temperature.

12. The magnetic field sensor of claim 1 wherein the at least two magnetic field sensing elements are selected from Hall effect elements, magnetoresistance elements, or both.

13. The magnetic field sensor of claim 1 wherein the analog-to-digital converter (ADC) is a dual-path ADC having a first path to process the measured magnetic field signal and a second path to process the reference magnetic field signal.

14. A magnetic field sensor, comprising:
  at least one magnetic field sensing element configured to generate a measured magnetic field signal responsive to an external magnetic field and to generate a reference magnetic field signal responsive to a reference magnetic field; and
  a calibration circuit configured to combine the measured magnetic field signal and the reference magnetic signal by dividing the measured magnetic field signal by the reference magnetic field signal to generate a combined, calibrated magnetic field signal that represents the external magnetic field.

15. The magnetic field sensor of claim 14 further comprising a reference coil proximate to the at least one magnetic field sensing element, wherein the reference coil is configured to carry a reference current to generate the reference magnetic field.

16. The magnetic field sensor of claim 14 further comprising at least one analog-to-digital converter responsive to the measured magnetic field signal to generate a digital measured magnetic field signal and to the reference magnetic field signal to generate a digital reference magnetic field signal, wherein the calibration circuit is configured to divide the digital measured magnetic field signal by the digital reference magnetic field signal to generate the calibrated magnetic field signal.

17. The magnetic field sensor of claim 16 further comprising a manufacturing trim circuit configured to adjust at least one of a gain or an offset of the digital measured magnetic field signal based on a sensed temperature.

18. The magnetic field sensor of claim 16 further comprising a calibration trim circuit configured to adjust a gain of the digital reference magnetic field signal based on a predetermined scale factor.

19. The magnetic field sensor of claim 18 wherein the calibration trim circuit is further configured to adjust at least one of the gain or an offset of the digital reference magnetic field signal based on a sensed temperature.

20. The magnetic field sensor of claim 14 wherein the at least one magnetic field sensing element is configured to generate the measured magnetic field signal during a first time period and is configured to generate the reference magnetic field signal during a second, non-overlapping time period.

21. The magnetic field sensor of claim 14 wherein the at least one magnetic field sensing element comprises a Hall effect element.

22. The magnetic field sensor of claim 14 wherein the at least one magnetic field sensing element comprises a magnetoresistance element.

23. The magnetic field sensor of claim 14 further comprising further comprising a built in self-test circuit configured to detect an error in the magnetic field sensor.

24. The magnetic field sensor of claim 14 further comprising an output signal generator responsive to the calibrated magnetic field signal to generate an output signal of the magnetic field sensor indicative of the external magnetic field.

25. The magnetic field sensor of claim 14 wherein the calibration circuit comprises a multiplier configured to generate the calibrated magnetic field signal based on a Taylor series expansion.

26. A method for calibrating a sensed magnetic field signal, comprising:
  generating a measured magnetic field signal having an amplitude dependent on an external magnetic field;
  generating a reference magnetic field signal having an amplitude dependent on a reference magnetic field;
  converting the measured magnetic field signal into a digital measured magnetic field signal and converting the reference magnetic field signal into a digital reference magnetic field signal; and
  combining the digital measured magnetic field signal and the digital reference magnetic field signal by dividing the digital measured magnetic field signal by the digital reference magnetic field signal to generate a combined, calibrated signal that represents the external magnetic field.

27. The method of claim 26 wherein dividing comprises multiplying a plurality of terms according to a Taylor series expansion.

28. The method of claim 26 further comprising adjusting at least one of a gain or an offset of the digital measured magnetic field signal based on a sensed temperature.

29. The method of claim 26 further comprising adjusting a gain of the digital reference magnetic field signal based on a predetermined scale factor.

30. The method of claim 29 wherein adjusting further comprises adjusting at least one of the gain or an offset of the digital reference magnetic field signal based on a sensed temperature.

31. The method of claim 26 wherein at least one of generating the measured magnetic field signal or generating the reference magnetic field signal comprises using at least one Hall effect element.

32. The method of claim 26 wherein at least one of generating the measured magnetic field signal or generating the reference magnetic field signal comprises using at least one magnetoresistance element.

33. The method of claim 26 further comprising detecting an error with a built in built-in self-test circuit.

34. A method for calibrating a sensed magnetic field signal, comprising:
  generating, by one or more coils, a measured magnetic field signal having an amplitude dependent on an external magnetic field;
  generating, by the one or more coils, a reference magnetic field signal having an amplitude dependent on a reference magnetic field; and
  dividing, by a calibration circuit, the measured magnetic field signal by the reference magnetic field signal to generate a combined, calibrated signal that represents the external magnetic field.

35. The method of claim 34 further comprising converting the measured magnetic field signal into a digital measured magnetic field signal and converting the reference magnetic field signal into digital reference magnetic field signal and wherein dividing comprises dividing the digital measured magnetic field signal by the digital reference magnetic field signal to generate the calibrated signal.

36. The method of claim 34 further comprising adjusting at least one of a gain or an offset of the digital measured magnetic field signal based on a sensed temperature.

37. The method of claim 34 further comprising adjusting a gain of the digital reference magnetic field signal based on a predetermined scale factor.

38. The method of claim 37 wherein adjusting further comprises adjusting at least one of the gain or an offset of the digital reference magnetic field signal based on a sensed temperature.

39. The method of claim 34 wherein dividing comprises multiplying a plurality of terms according to a Taylor series expansion.

40. The method of claim 34 wherein at least one of generating the measured magnetic field signal or generating the reference magnetic field signal comprises using at least one Hall effect element.

41. The method of claim 34 wherein at least one of generating the measured magnetic field signal or generating the reference magnetic field signal comprises using at least one magnetoresistance element.

42. The method of claim 34 further comprising detecting an error with a built in built-in self-test circuit.

\* \* \* \* \*

UNITED STATES PATENT AND TRADEMARK OFFICE
CERTIFICATE OF CORRECTION

PATENT NO. : 9,841,485 B2
APPLICATION NO. : 14/541735
DATED : December 12, 2017
INVENTOR(S) : Craig S. Petrie et al.

It is certified that error appears in the above-identified patent and that said Letters Patent is hereby corrected as shown below:

In the Specification

Column 2, Line 5, remove "by" after example,

Column 2, Line 6, remove the "a" after the word in

Column 2, Line 8, replace "sensor." with --sensor,"--

Column 4, Line 10, insert --2-- after the abbreviation FIG.

Column 5, Line 39, replace "105" with --165--

Column 6, Line 50, insert --to-- after the word configured

Column 6, Line 62, replace "predicable" with --predictable--

Column 6, Lines 64-65, replace "magnetic field and the external magnetic field" and replace with --magnetic field 206 and the external magnetic field 106--

Column 9, Lines 57-58, insert --the-- after the word during

Column 11, Line 18, insert --during-- after the word only

Column 14, Line 29, replace "and. If" with --and if--

Column 14, Line 66, replace "$C_{IN}$" with --$V_{IN}$--

Column 16, Line 58, remove the "a" before U.S. Patent No.

Column 18, Line 39, replace "general" with --generally--

Signed and Sealed this
Sixteenth Day of October, 2018

Andrei Iancu
*Director of the United States Patent and Trademark Office*

CERTIFICATE OF CORRECTION (continued)
U.S. Pat. No. 9,841,485 B2

Column 21, Line 12, insert --a-- before the word reference

Column 21, Line 16, replace the word "timer" with --time--

Column 22, Line 8, insert --that-- after the word appreciated

In the Claims

Column 23, Line 2, remove the first instance of "built-in"

Column 24, Lines 10-11, remove the word "further" after the word comprising

Column 24, Line 58, remove the first instance of "built-in"

Column 25, Line 6, insert --a-- after into

Column 25, Line 31, remove the first instance of "Built-in"